US006271474B1

(12) United States Patent
Fujikami et al.

(10) Patent No.: US 6,271,474 B1
(45) Date of Patent: Aug. 7, 2001

(54) METHODS OF MANUFACTURING OXIDE SUPERCONDUCTING STRANDED WIRE AND OXIDE SUPERCONDUCTING CABLE CONDUCTOR, AND COATED WIRE, STRANDED WIRE AND CABLE CONDUCTOR

(75) Inventors: Jun Fujikami; Nobuhiro Saga; Shuji Hahakura; Kazuya Ohmatsu, all of Osaka; Hideo Ishii, Tokyo; Shoichi Honjo, Tokyo; Yoshihiro Iwata, Tokyo, all of (JP)

(73) Assignees: Sumitomo Electric Industries, Ltd., Osaka; The Tokyo Electric Power Company, Tokyo, both of (JP)

( * ) Notice: Subject to any disclaimer, the term of this patent is extended or adjusted under 35 U.S.C. 154(b) by 0 days.

(21) Appl. No.: 09/188,242

(22) Filed: Nov. 9, 1998

(30) Foreign Application Priority Data

Nov. 14, 1997 (JP) .................................................. 9-313889

(51) Int. Cl.[7] ...................................................... H01B 12/08
(52) U.S. Cl. ........................ 174/125.1; 505/230; 505/231; 505/431; 505/887
(58) Field of Search ........................ 174/125.1; 505/230, 505/231, 236, 237, 431, 704, 884, 887; 29/599

(56) References Cited

U.S. PATENT DOCUMENTS

| 5,283,232 | * | 2/1994 | Kohno et al. ................. 174/125.1 X |
| 5,952,614 | * | 9/1999 | Ries ................................ 174/125.1 X |

FOREIGN PATENT DOCUMENTS

| 282 286 | * | 9/1988 | (EP) ................................. 174/125.1 |
| 0 803 917 | | 10/1997 | (EP) . |
| 96/28853 | | 9/1996 | (WO) . |

* cited by examiner

Primary Examiner—Albert W. Paladini
(74) Attorney, Agent, or Firm—Foley & Lardner

(57) ABSTRACT

An oxide superconducting stranded wire having inter-strand insulation and high critical current is provided. A wire including an oxide superconducting material and a matrix covering the material and consisting essentially of silver or a silver alloy is coated with a paint containing, as a main component, an organometallic polymer such as a silicone polymer or aluminum primary phosphorus in a paint reservoir, and the paint is baked in a baking furnace via a drying furnace. A plurality of such wires with the baked paint are twined into a stranded wire, which is then heated up to a temperature necessary for sintering the oxide superconducting material. The stranded wire thus obtained through the step of sintering may have high critical current. A heat-resisting insulating coating layer may be formed by baking the paint.

34 Claims, 12 Drawing Sheets

CIRCUIT MODEL OF N-LAYER CONDUCTOR

MODEL OF MAGNETIC DIRECTION AND CURRENT DIRECTION

METHODS OF MANUFACTURING OXIDE SUPERCONDUCTING STRANDED WIRE AND OXIDE SUPERCONDUCTING CABLE CONDUCTOR, AND COATED WIRE, STRANDED WIRE AND CABLE CONDUCTOR

BACKGROUND OF THE INVENTION

1. Field of the Invention

The present invention relates to techniques for manufacturing stranded wires and cable conductors using oxide superconductor, and more particularly, to techniques for providing an electrically insulating material suitable for the step of sintering oxide superconductor, and providing a stranded wire and a cable conductor which have high critical current, using such an electrically insulating material.

2. Description of the Background Art

Since the oxide superconducting wire exhibits superconductivity at liquid nitrogen temperature, its application to superconducting cables and the like has been expected and its development has been ongoing. Since a wire having a bismuth-based 2223-phase oxide superconductor sheathed with silver in particular can be readily formed long, and a relatively high critical current density (Jc) results, the research and development is proceeding.

When an oxide superconducting wire is directed to alternating current (ac) application, a problem of ac losses is encountered. Particularly when such a wire is applied to a power cable, a loss by a self-magnetic field is problematic. It is known that the loss by self-magnetic field is effectively reduced by employing the structure in which wires that form the power cable are translocated. Translocation of the wires may be achieved by twining the wires. In the process of twining the wires, however, great bending strain is loaded upon the wires, and therefore it has been quite difficult to twine the wires having relatively fragile oxide superconductor, without reducing the superconducting property. In order to obtain significant effects by twining the wires, it is also important to provide the wires with electrical insulation. In a stranded wire using a metal-based superconductor, for example, the strands are coated with enamel. In the field of $Nb_3Sn$ application, glass is used as an insulating material. When a $Nb_3Sn$ superconducting coil is manufactured by the wind-and-react process, for example, wires coated with glass are wound into a coil and heat-treated.

The cable conductor in which tape-shaped silver-sheathed bismuth-based superconducting wires are spirally wound on a former in layers is generally known. Such a structure, however, can easily generate current drift.

SUMMARY OF THE INVENTION

An object of the present invention is to provide a technique for manufacturing a stranded wire and a cable conductor having good superconducting property, using an oxide superconducting wire.

Another object of the present invention is to find a preferable electrically insulating material and to provide an oxide superconducting stranded wire and an oxide superconducting cable conductor using such a material.

Yet another object of the present invention is to provide an oxide superconducting stranded wire and an oxide superconducting cable conductor having good superconducting property and reduced ac losses.

A still further object of the present invention is to provide a structure with reduced ac losses in an oxide superconducting cable conductor.

Provided according to the present invention is a method of manufacturing a stranded wire using wires comprising an oxide superconducting material and a matrix covering the material and consisting essentially of silver or a silver alloy. The method includes the steps of applying a paint containing, as an essential component, boron nitride or a compound which thermally decomposes at a temperature equal to or lower than the temperature necessary for sintering the oxide superconducting material and generates an electrically insulating ceramics onto the surface of the matrix of the wire comprising the oxide superconducting material and the matrix covering the material and consisting essentially of silver or a silver alloy, baking the paint at a temperature equal to or lower than the temperature necessary for sintering the oxide superconducting material, preparing a plurality of such wires having the baked paint, twining the obtained plurality of wires, and heating the resulting stranded wire up to the temperature necessary for sintering the oxide superconducting material.

In the manufacturing method according to the invention, a paint containing an organometallic polymer such as a silicon-based organometallic polymer as a main component, a paint containing aluminum phosphate as a main component or the like may be applied to the wires. The shape of a cross section perpendicular to the longitudinal direction of the wires to form the stranded wire is preferably a circle or a polygon substantially in rotation symmetry. In the manufacturing method according to the present invention, the oxide superconducting material inside is preferably densified by subjecting the wires to a plastic working before applying the paint. Furthermore, in the manufacturing method according to the invention, after twining the wires, the resulting stranded wire may be shaped to have a sectoral cross section. Alternatively, after twining the wires, the resulting stranded wire may be shaped into a flat form. Subsequently, the shaped stranded wire is heated up to the temperature necessary for sintering the oxide superconducting material. The sintering after the shaping reduces or cancels the influence at the time of the shaping, and results in a shaped stranded wire having a high critical current and a high critical current density. The shaped stranded wire is useful in forming a more compact cable conductor.

According to the invention, a method of manufacturing a superconducting cable conductor which includes the step of winding a plurality of the stranded wires obtained by the above manufacturing method on a cylindrical or spiral former is provided.

According to the invention, coated wires which can be used for manufacturing an oxide superconducting stranded wire is provided. The coated wire includes a filament portion consisting essentially of an oxide superconducting material, a matrix covering the filament portion and consisting essentially of silver or a silver alloy, and a coating layer produced by baking at 200° C. to 800° C. a paint containing, as a main component, boron nitride or a compound which thermally decomposes at a temperature equal to or lower than the temperature necessary for sintering the oxide superconducting material to generate an electrically insulating ceramics.

In the coated wire according to the invention, the coating layer may be composed of a material produced by baking an organometallic polymer such as a silicon-based organometallic polymer at a temperature in the range from 200° C. to 800° C. The coating layer may also be composed of a material produced by baking aluminum phosphate at a temperature in the range from 500° C. to 800° C.

According to the invention, an oxide superconducting stranded wire produced by twining a plurality of the above-described coated wires and subjecting the twined wires to a heat-treatment necessary for sintering the oxide superconducting material is provided. According to the present invention, an oxide superconducting stranded wire produced by twining a plurality of the coated wires described above, shaping a resulting stranded wire to have a sectoral cross section or into a flat form, and performing a heat-treatment necessary for sintering the oxide superconducting material is provided. In these stranded wires, the strand includes a filament consisting essentially of an oxide superconductor, a stabilizing matrix covering the filament and consisting essentially of silver or a silver alloy, and an electrically insulating ceramic film covering the stabilizing matrix. The electrically insulating ceramics film can have a dense structure and a substantially even thickness along the longitudinal direction of the wire. The strand is preferably a multifilamentary wire having a plurality of filaments. A cross section of the strand is preferably a circle, an ellipse or a substantially regular polygon. According to the present invention, an oxide superconducting cable conductor produced by winding a plurality of such oxide superconducting stranded wires on a cylindrical or spiral former may also be provided.

According to the invention, another method of manufacturing a stranded wire using wires comprising an oxide superconducting material and a matrix covering the material and consisting essentially of silver or a silver alloy is provided. The method includes the steps of plating the surface of the matrix of the wire with a nonmagnetic metal which generates an electrically insulating oxide by the oxidation at a temperature equal to or lower than the temperature necessary for sintering the oxide superconducting material, preparing a plurality of wires plated with the nonmagnetic metal, twining a plurality of the resulting wires, oxidizing the nonmagnetic metal on the resulting stranded wire, and heating the resulting stranded wire up to the temperature necessary for sintering the oxide superconducting material.

In the manufacturing method, copper, tin, lead or the like may be used as the nonmagnetic metal. The shape of a cross section perpendicular to the longitudinal direction of the wires to be twined is preferably a circle or a polygon substantially in rotation symmetry. Also in this manufacturing method, the wires are preferably subjected to a plastic working before the step of plating, such that the oxide superconducting material is densified. The resulting stranded wire after the step of twining and before the step of sintering may be shaped to have a sectoral cross section or shaped into a flat form.

According to the present invention, a method of manufacturing an oxide superconducting cable conductor which includes the step of winding a plurality of stranded wires obtained by the above-described manufacturing method on a cylindrical or spiral former is provided.

Furthermore, according to the present invention, a coated wire which can be used in the above method of manufacturing the oxide superconducting stranded wire is provided. The coated wire includes a filament portion consisting essentially of an oxide superconducting material, a matrix covering the filament portion and consisting essentially of silver or a silver alloy, and a plating layer covering the surface of the matrix and consisting essentially of a nonmagnetic material which generates an electrically insulating oxide by the oxidation at a temperature equal to or lower than the temperature necessary for sintering the oxide superconducting material. In the coated wire, copper, tin, lead or the like may be used as the nonmagnetic metal. The shape of a cross section perpendicular to the longitudinal direction of the wire is preferably a circle or a polygon substantially in rotation symmetry.

According to the present invention, an oxide superconducting stranded wire produced by twining a plurality of the coated wires as described above, oxidizing the plating layer, and heating the twined wires up to the temperature necessary for sintering the oxide superconducting material is provided. In the stranded wire, the twined wires are electrically insulated from each other by the oxide of the nonmagnetic metal. Further, according to the invention, an oxide superconducting stranded wire produced by twining a plurality of the coated wires as described above, shaping the resulting stranded wire to have a sectoral cross section or into a flat form, oxidizing the plating layer, and sintering the shaped stranded wire. In the stranded wire, the twined wires are electrically insulated from each other by the oxide of the nonmagnetic metal. In these stranded wires, the strand includes a filament consisting essentially of an oxide superconductor, a stabilizing matrix covering the filament and consisting essentially of silver or a silver alloy, and a layer covering the stabilizing matrix and consisting essentially of the oxide of the nonmagnetic metal. The layer of the oxide of the nonmagnetic metal can have a dense structure, and can have an substantially even thickness along the longitudinal direction of the wire. The strand is preferably a multi-filamentary wire having a plurality of filaments. The shape of a cross section of the strand is preferably a circle, an ellipse or an substantially regular polygon. According to the present invention, a superconducting cable conductor produced by winding a plurality of such stranded wires on a cylindrical or spiral former is provided.

In the above-described oxide superconducting cable conductor, the plurality of stranded wires may be wound spirally on the former in a plurality of layers. The relation represented by $Pn \leq Pm$ is preferably established between the spirally winding pitch Pm of the stranded wire in the m-th layer (m: an integer not less than 1) in the plurality of layers and the spirally winding pitch Pn of the stranded wire in the n-th layer (n: an integer not less than 2, m<n) in the plurality of layers. The number of the layers is more preferably 2 in view of flexibility in designing.

In the oxide superconducting cable conductor according to the present invention, cross sections of the plurality of filaments consisting essentially of the oxide superconducting material may be an approximate rectangle or ellipse having an aspect ratio of at least 2. In this case, the longer axis of the filament cross section in the stranded wire on the former is preferably aligned with the circumferential direction of the former.

The oxide superconducting cable conductor according to the present invention may have a layer or layers having the stranded wires wound right-handedly and a layer or layers having the stranded wires wound left-handedly. The number of the right-handedly wound layer or layers is preferably equal to the number of the left-handedly wound layer or layers.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
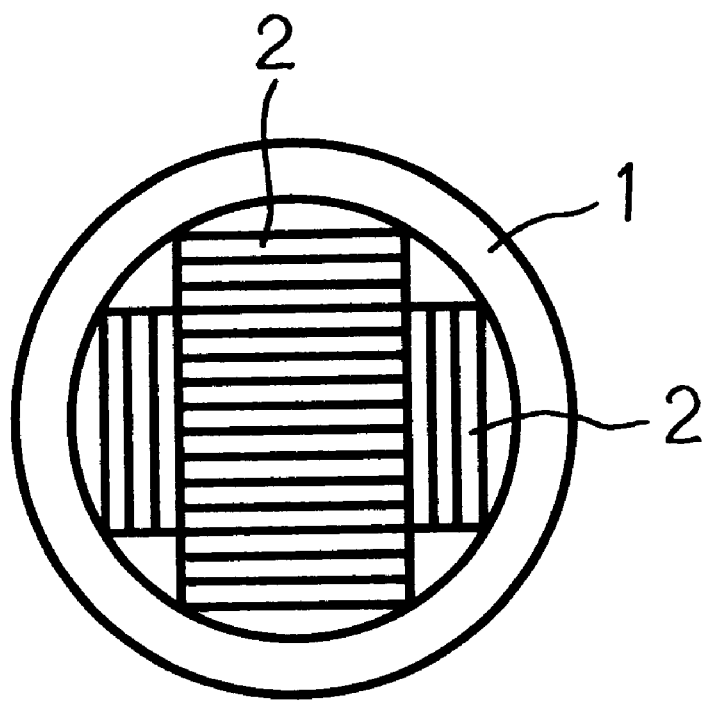
FIG. 1 is a schematic cross sectional view of a silver pipe filled with tape wires for manufacturing a wire used according to the present invention.

In the manufacture of a wire having an oxide superconductor such as a bismuth-based 2223-phase oxide superconductor sheathed with a stabilizing metal such as silver and a silver alloy, for example, sintering is carried out at a temperature as high as about 850° C. The wire having the sintered body is relatively weak to bending strain, and for example bending strain exceeding 0.3% can result in a degradation in the critical current. Therefore, when a plurality of the wires obtained through the sintering step are twined, the sintered body could be destroyed by bending strain, and a characteristic such as critical current could deteriorate in each of the wires. The inventors have attempted to obtain a sintered structure of an oxide superconductor having good superconducting property in a stranded wire by performing a heat-treatment for sintering after the step of twining the wires.

If a method of sintering after twining wires is employed, conventionally used organic compounds such as enamels which decompose at a temperature of about 500° C. cannot be used. The inventors have researched in order to find out an insulating material enduring the sintering temperature of the oxide superconductor, and having high adhesiveness to the wire and high strength. As a result, it has been found that compounds such as organometallic polymers including silicon-based organometallic polymers and aluminum phosphate, which thermally decompose at a temperature equal to or lower than the temperature necessary for sintering an oxide superconducting material to generate an electrically insulating ceramics, and boron nitride bring about an insulating coating having high heat resistance, adhesiveness and strength. These materials have such a characteristic that they bring about a highly adhesive coating film on the surface of the wire in a suitable manner, gradually produce ceramics in the heat-treatment and become densified. Using these materials, a coating layer which hardly peels off at the time of twining and having high strength can be formed.

In the manufacturing method according to the invention, a paint containing, as a main component, boron nitride or a compound which thermally decomposes at a temperature equal to or lower than the temperature necessary for sintering an oxide superconducting material to generate an electrically insulating ceramics is applied to the surface of the matrix of the wire. The paint may contain ceramics powder, inorganic pigment, filler, dispersing agent for paint, solvent and the like to such an extent that they do not impede the formation of a highly adhesive electrically insulating ceramics. The content of the main component in the paint is not particularly limited, and the paint is prepared such that an appropriate viscosity results depending upon the material, thickness and the like of the coating layer to be formed.

According to the present invention, the organometallic polymer such as a silicon-based organometallic polymer may form an insulating coating layer having high heat resistance, adhesiveness and strength. The organometallic polymer refers to a polymer of a compound having a carbon-metal bond. A preferable organometallic polymer according to the present invention is a silicon-based organometallic polymer. The silicon-based organometallic polymer is a polymer of a compound having a carbon-silicon bond and includes silicone resins or silicone polymers having a skeleton in which organic group bonded silicon and oxygen are alternately bonded, Tirano polymers (polytitanocarbosilane) in which the main chain of a polycarbosilane skeleton (—(Si—C)$_n$—) is cross-linked by a titano organic compound to form a net-shaped organosilicon polymer. After applying a paint containing, as a main component, the silicone polymer, the Tirano polymer and the like to the wire, the paint may be baked at a temperature in the range from 200° C. to 800° C. The coating film formed by the step of baking may have various compositions depending upon the temperature of baking. For example, if the baking is performed at a relatively low temperature, the organometallic polymer such as silicone polymer and Tirano polymer remain as they are in the formed coating film. Meanwhile, if the baking temperature is high, the organometallic polymer thermally decomposes. A coating film having part of the organometallic polymer thermally decomposed may be formed. By baking at a higher temperature, a coating film in which the organometallic polymer completely thermally has decomposed into ceramic, particularly into amorphous ceramic may be formed. In any of the cases, the remaining organometallic polymer or the non-ceramic product by the thermal decomposition of the organometallic polymer will be converted into an electrically insulating ceramic, particularly into an amorphous ceramic at the temperature necessary for sintering the oxide superconducting material. According to the present invention, the thickness of the coating film may be in the range from 1 $\mu$m to 200 $\mu$m. For example, the wire resulting after the step of baking the paint has a coating layer composed of the material produced by baking the organometallic polymer such as silicone polymer or Tirano polymer as described above on the surface of the wire at a temperature in the range from 200° C. to 800° C. The composition of the coating layer varies depending upon the temperature as described above, but the coating layer does not peel off from the surface of the matrix of the wire at a temperature of about 900° C. and has electrical insulation in any of the cases. As compared to a wire having a ceramic coating formed from a paint simply containing $SiO_2$ particles, $Al_2O_3$ particles or the like dispersed in a dispersing medium, the wire according to the invention less suffers from cracking and peeling off of the ceramic coating caused by bending strain at room temperature, and has high adhesiveness and adhesion stability in the coating. In the manufacturing method according to the invention, the organometallic polymer is finally converted into an electrically insulating ceramic, particularly into an amorphous ceramic, but this final step may be completed in the step of baking the paint or in the step of sintering after twining the wires having the coating film. If silicone polymer or a silicone resin is thermally decomposed into ceramic, the resulting ceramic may be composed of silicon and oxygen with siloxane bond remaining. Meanwhile, if the Tirano polymer is thermally decomposed to obtain a ceramic, an amorphous ceramic composed of silicon, carbon, oxygen and titanium may be obtained. In the ceramic available from the Tirano polymer, carbosilane bond and a very small amount of siloxane bond may remain. Paints containing silicone polymer (silicone resin) or Tirano polymer as a main component is commercially available.

According to the present invention, a paint containing aluminum phosphate, particularly aluminum primary phosphate (Al $(H_2PO_4)_3$) as a main component may also be used. The paint may contain an aqueous aluminum phosphate solution and other materials such as pigment and dispersing agent. After the paint is applied to the wire, the paint may be baked at a temperature in the range from 500° C. to 800° C. for a thermal decomposition reaction including a dehydration reaction resulting in an electrically insulating ceramic film. The thickness of the coating film produced by the baking may be in the range from 1 $\mu$m to 200 $\mu$m.

According to the present invention, a paint containing boron nitride (BN) as a main component may also be used. In addition to boron nitride powder, the paint may include an inorganic binder and a dispersing medium for paint. The average grain size of the boron nitride powder may be in the range from 0.1 $\mu$m to 2 $\mu$m, and preferably in the range from 0.1 $\mu$m to 1 $\mu$m. Water, xylene or the like may be used as the dispersing medium. A silicone resin or the like may be used as the binder. By baking the paint at a temperature in the range from 300° C. to 900° C., an electrically insulating ceramic film composed of boron nitride and the binder can be formed. The film has high adhesiveness and strength and can endure a temperature of about 1000° C.

Meanwhile, according to the present invention, in place of forming the coating layer using the paint as described above, a plating layer of a nonmagnetic metal may be formed. The plating layer is highly flexible and adhesive. Magnetic materials such as Ni and Cr give rise to a great hysteresis loss and therefore are not suitable for ac cables. Therefore, the wire is preferably plated with a nonmagnetic metal such as copper, tin and lead. The plating may be carried out by electroplating using a copper pyrophosphate bath, or a bath of a nonmagnetic metal borofluoride salt. The thickness of the plating layer may be in the range from 0.5 $\mu$m to 5 $\mu$m, or not less than 10 $\mu$m. According to the invention, the plating layer is oxidized to form an electrically insulating oxide film. In order to effectively prevent current drift between the strands in a stranded wire, the plated layer having a thickness of at least 5 $\mu$m is preferably changed into an oxide film. In order to maintain the electrical insulation between the strands at a high voltage, the thickness of the oxide film is preferably 5 $\mu$m, more preferably at least 10 $\mu$m. The thickness of the oxide film is preferably in the range from 5 $\mu$m to 100 $\mu$m, more preferably in the range from 10 $\mu$m to 30 $\mu$m. If copper is used as the nonmagnetic metal, in a heat-treatment process for sintering the oxide superconductor after twining the wires plated with copper, the surface of the copper plating layer or the entire copper plating layer may be changed into copper oxide. The copper oxide layer serves as a preferable electrically insulating layer.

A plurality of the wires having the coating film formed as described above or a plurality of the wires having the nonmagnetic metal plating layer are twined to form a stranded wire. The resulting stranded wire is subjected to a heat-treatment to sinter the oxide superconductor. The heat treatment for sintering is performed for example at a temperature in the range from 800° C. to 900° C., preferably at a temperature in the range from 840° C. to 850° C. By sintering after forming the stranded wire, the influence of strain at the time of twining is reduced or eliminated, so that a stranded wire having a high critical current and a high critical current density is obtained.

A wire using a bismuth-based oxide superconducting material, particularly a bismuth-based 2223-phase oxide superconducting material can have its filaments densified by carrying out plastic working and heat-treatment plural times, such that the critical current density of the wire can be increased. Therefore, preferably after subjecting the wire to plastic working for the purpose of densifying the filaments and before the final heat-treatment, the application of the paint or the plating of the nonmagnetic metal is carried out. Subsequently, after the step of twining the wires, the final heat-treatment for sintering is performed, so that an oxide superconducting stranded wire having a high critical current density and having its strands electrically insulated from each other can be obtained.

In addition, the resulting stranded wire may be shaped into a flat form or a sectoral form so that the packing factor is increased and the stranded wire is more compact.

A stranded wire of a higher order, i.e., secondary or more may be obtained by repeating the step of twining. Thus, a stranded wire with a greater current-carrying capacity may be provided. The greater the number of strands, the greater is the effect of the translocation, and ac losses can be reduced. In such a case, the size of the strand is advantageously 1.5 mm$\phi$ or smaller, preferably 0.5 mm$\phi$ or smaller in order to obtain a stranded wire which is compact and has reduced ac losses. Also according to the present invention, since sintering may be performed after the step of twining, the strand pitch may be shortened to further reduce ac losses.

A plurality of such superconducting stranded wires manufactured in the above described manner may be integrated onto a cylindrical or spiral core member called former to manufacture a superconducting cable conductor. The former may be composed of copper, stainless steel, aluminum, FRP (Fiber Reinforced Plastic) or the like. The plurality of stranded wires may be wound spirally on the former in a single layer or two or more layers. For example, the plurality of stranded wires may be wound on a cylindrical or spiral former in a single layer to obtain a superconducting cable conductor having its strands fully translocated. In such a structure, a loss by self-magnetic field generated by the application of ac current may be reduced. Spirally winding the superconducting stranded wire on the former is also desirable in view of providing a cable conductor having proper flexibility.

Since the terminal portion of the resulting cable conductor will be connected to a normal conducting current lead or another superconducting cable conductor, the terminal portion may satisfy the following conditions.

(a) The insulating material is removed from the terminal portion.

(b) The length of the terminal portion is longer than the strand pitch of the stranded wire. The terminal portion is preferably at least twice as long as the strand pitch. More specifically, the wires are twined at the terminal portion as well.

(c) The connection resistance of the terminal portion is smaller than the impedance of the main conductor portion. In the case of a long conductor having a length of at least several ten meters, the influence of the terminal portion is relatively small, but the influence of the terminal portion is greater in the case of a short conductor having a length of not more than several meters. The terminal portion should be formed to satisfy the above-described conditions, if it is necessary to prevent the translocated current at the terminal portion from being uneven and the effect of reducing ac losses from being small.

In a single-layer conductor, the positions of all the strands can be substantially equalized electromagnetically by translocation. In this case, the distribution of current in the conductor can be even, so that ac losses by current drift can be prevented from increasing. If the stranded wires are wound spirally on the core member, it is advantageous that the stranded wires are wound in two layers and the direction of winding is reversed between the first and second layers to cancel out the magnetic field components in the longitudinal direction of the conductor. In the case of a conductor having the stranded wires in two or more layers, current drift caused by impedance difference between the layers and increase in the ac losses associated therewith is desirably prevented or restrained as much as possible.

The oxide superconductors used according to the present invention include bismuth-based oxide superconductors, thallium-based oxide superconductors, mercury-based oxide superconductors, yttrium-based oxide superconductors and the like. Particularly, bismuth-based 2223-phase oxide superconductors such as $(Bi, Pb)_2Sr_2Ca_2Cu_3O_{10-x}$ and $Bi_2Sr_2Ca_2Cu_3O_{10-x}$ are preferably used. As the stabilizing matrix for the oxide superconductor, silver or silver alloys are used. The silver alloys may include Ag—Au alloys, Ag—Mn alloys, Ag—Al alloys, Ag—Sb alloys, Ag—Ti alloys and the like. When an sintered body of such a bismuth-based oxide superconductor is produced, the heat-treatment is preferably carried out at a temperature in the range from 700° C. to 900° C., and particularly in the final heat treatment after twining the wires, the temperature is desirably maintained in the range from 840° C. to 850° C. for a prescribed time period. The heat-treatment to produce the sintered body may be carried out in oxidative atmosphere such as air.

Figure 6:
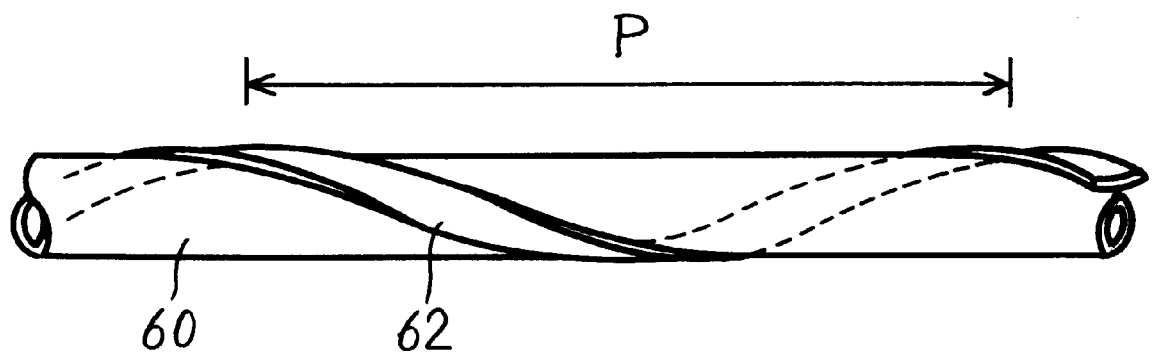
FIG. 6 is a perspective view showing how the stranded wire is spirally wound in a cable conductor.
Figure 7A:
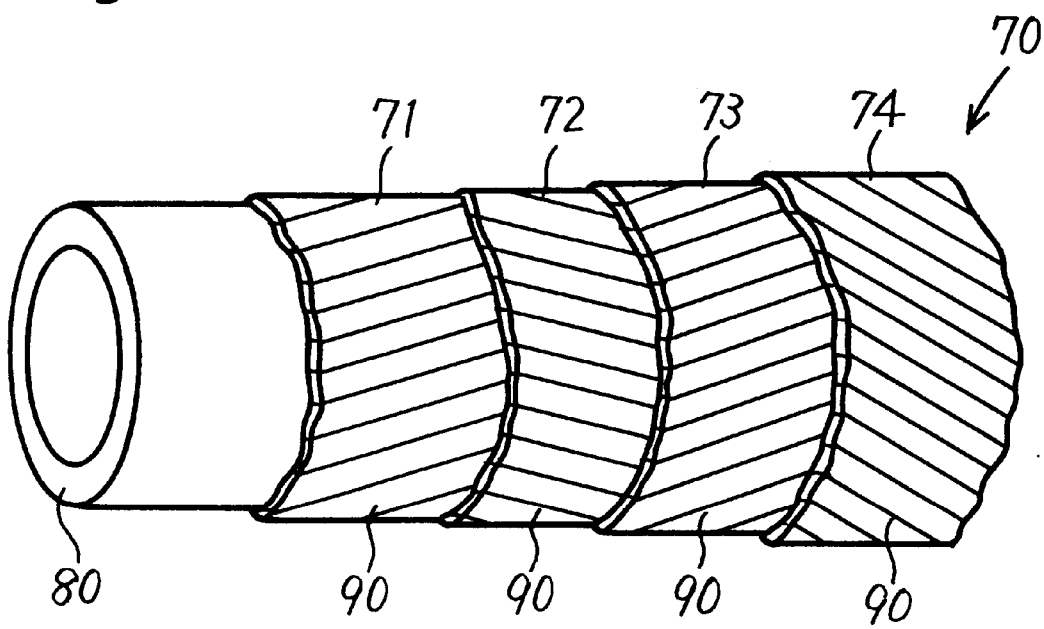
FIGS. 7A and 7B are a perspective view and a cross sectional view, respectively showing an example of a multi-layer cable conductor according to the present invention.
Figure 7B:
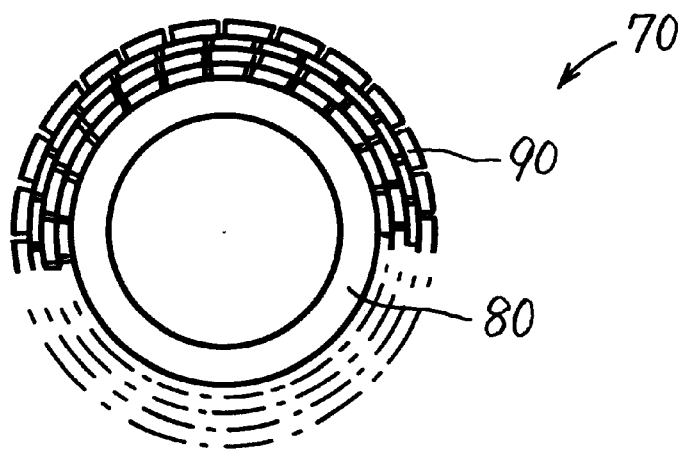

According to the present invention, a conductor having a large capacity may be obtained by winding a plurality of stranded wires on a former in multi-layers. As shown in FIG. 6, each stranded wire 62 is spirally wound on a former 60 at a prescribed pitch P to form a conductor of a large capacity. A plurality of stranded wires are wound on a former in two or more layers to obtain a conductor of a multi-layer structure. FIGS. 7A and 7B for example show a conductor of a four-layer structure. In superconducting cable conductor 70, flat-shaped stranded wires 90 are spirally wound on cylindrical former 80 in four layers. The first layer 71 is wound light-handedly, the second layer 72 left-handedly, the third layer 73 light-handedly, and the fourth layer 74 left-handedly. According to the present invention, the direction of winding may be alternately changed, but the direction of winding is not limited to this case. For example, all the layers may be wound in the same direction, or the direction may be changed each for a plurality of layers. Also, according to the present invention, the number of layers may be optionally selected depending upon the application and specification and the like.

In a cable conductor produced by spirally winding stranded wires on a former in multi-layers, the spiral pitch of the stranded wire preferably decreases in the direction from the former to the outer layer. More specifically, the relation represented by $Pn \leq Pm$ is preferably established between spiral pitch Pm at the m-th layer (m: an integer of at least 1) and spiral pitch Pn at the n-th layer (n: an integer of at least 2, m<n). In such a structure, the difference in the impedance between the layers can be reduced. As a result, not only current drift within each of the layers, but also current drift between the layers can be restrained, and a cable conductor of a large capacity and with reduced losses can be attained.

In the multi-layer conductor, the number of right-handedly wound layers and the number of left-handed layers may be matched, such that a magnetic field in the axial direction generated in the conductor can be weaker than the case of winding the stranded wires in the same direction in all the layers. Such a structure may reduce the impedance of the conductor.

As a result of various analyses described later, it has been found that the pitch range available for uniform current distribution in the conductor narrows as the number of layers increases. It has been found that if the number of layers is 2, the pitch necessary for such uniform current distribution is available from a wider range depending on the structure of the conductor, which enables flexible designing, and such uniform current distribution can be most easily achieved.

Figure 8A:
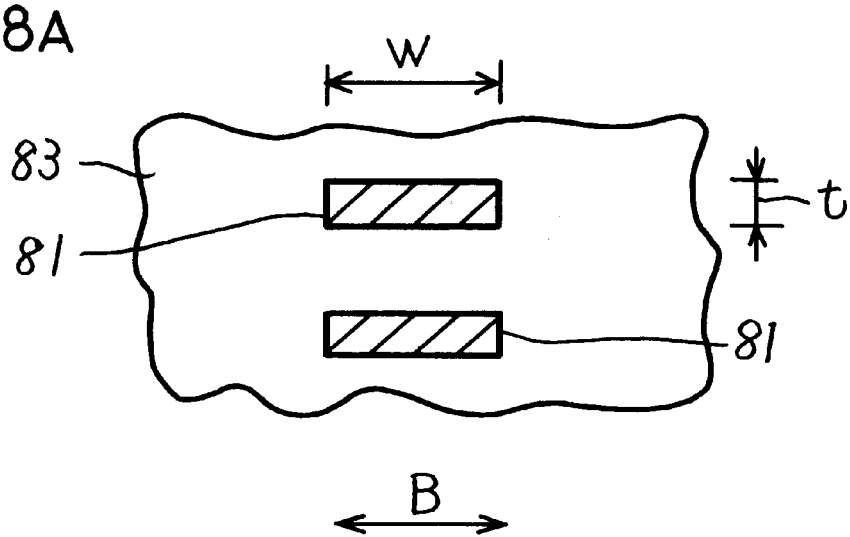
FIGS. 8A and 8B are schematic views each showing the shape of a superconducting filament covered with a stabilizing matrix.
Figure 8B:
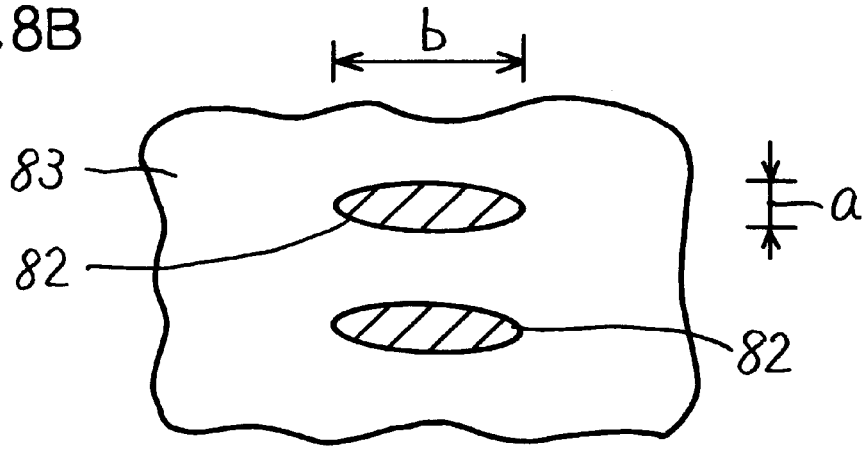

Since an oxide superconductor is a highly anisotropic material, the plate-shaped structure of superconductor crystals is preferably oriented in the superconducting filaments of the stranded wire. Also according to the present invention, the shape of a cross section of the superconducting filament of the oxide superconductor is preferably an approximate rectangle or an approximate ellipse having an aspect ratio of at least 2. In the case of the rectangle, the aspect ratio may be the ratio of the longer side to the shorter side, and in the case of the ellipse, the aspect ratio may be the ratio of the longer axis to the shorter axis. FIGS. 8A and 8B each show an example of a superconducting filament embedded in a stabilizing matrix. As shown in FIG. 8A, a cross section of superconducting filament 81 embedded in the stabilizing matrix 83 of a stranded wire is approximately rectangular. The aspect ratio of filament 81 may be obtained as w/t. As shown in FIG. 8B, a cross section of superconducting filament 82 embedded in the stabilizing matrix 83 of a stranded wire is approximately elliptical.

The aspect ratio of filament 82 may be obtained as b/a. The superconducting filament having such a rectangular or elliptical cross section perpendicular to the longitudinal direction may be obtained by plastic working such as rolling in the process of manufacturing wires for a stranded wire or by shaping a stranded wire into a flat-shape. The plate-shaped superconductor structure is oriented by the compressing force during the process.

Figure 9:
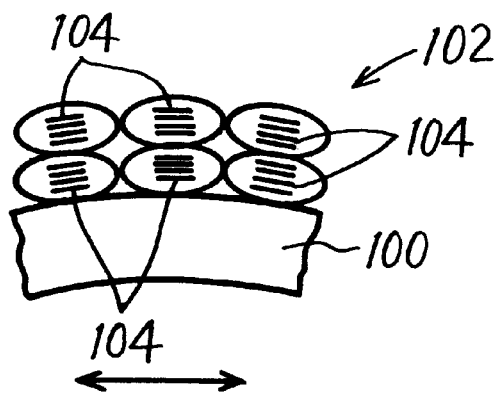
FIG. 9 is a schematic view showing the state in which the superconducting filaments of the stranded wires wound around a former in a superconducting cable conductor are aligned with the circumferential direction of the former.
Figure 10:
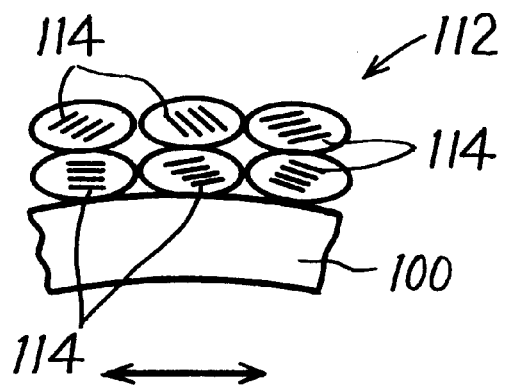
FIG. 10 is a schematic view showing the state in which the superconducting filaments of the stranded wires wound around a former are not much aligned with the circumferential direction of the former in a superconducting cable conductor.

The approximately rectangular or elliptical superconducting filament has high anisotropy to a magnetic field. When a magnetic field is applied in the direction denoted by the arrows in FIG. 8A, in other words in the direction parallel to the longer axis of the cross section of the superconducting filament, a relatively good critical current density (Jc)-magnetic field (B) characteristic results. This may be utilized for a superconducting cable conductor. As regards a superconducting cable conductor having the structure in which wires are integrated on a former, the main component of the magnetic field generated from the energized cable conductor is in the circumferential direction. Hence, if the cross section of the superconducting filament is a rectangle or ellipse, the longer axes of the cross sections of the filaments are preferably aligned substantially parallel to the circumferential direction (the circumferential direction of the former). The longer axes of all the filament cross sections are preferably aligned in the circumferential direction in the stranded wire wound around the former. However, if the longer axes of the cross sections of a major number of (for example at least half) filaments of all the filaments in the stranded wire are aligned in the circumferential direction, a preferable critical current density-magnetic field characteristic can be obtained. The case in which the longer axes of filament cross sections in the stranded wire are aligned and the case in which they are not aligned are shown in FIGS. 9 and 10, respectively. As shown in FIG. 9, in a stranded wire 102 wound around a former 100, the longer axes of a plurality of filament cross sections 104 are aligned substantially parallel to the circumferential direction (the direction denoted by the arrow) of former 100 among the plurality of strands. Meanwhile, in a stranded wire 112 wound around former 100 shown in FIG. 10, the direction of the longer axes of a plurality of filament cross sections 114 are directed in different directions among the strands. The stranded wire in which the directions of the filaments are aligned may be prepared by adjusting rearward tension loaded on the strands at the time of twining, adjusting the ratio of twining back, controlling the compressing force at the time of shaping the stranded wire and the like. During adjusting the twining back ratio, by controlling the rotation speed of the strand supply bobbin, specifically, by rotating the bobbin one time around each at the time of winding one pitch for adjusting the twining back, for example, the directions of the strands may be aligned, such that the directions of the filaments may be aligned. In addition, by shaping the stranded wire into a flat shape with an appropriate compressing force, for example, a stranded wire in which the longer axes of the cross sections of the filaments inside are directed substantially perpendicularly to the direction of the compressing force applied may be provided.

According to the present invention, a wire produced by the powder-in-tube process may be employed. In order to obtain a stranded wire according to the present invention, in particular, wires (strands) whose cross sections are a circle or polygon substantially in rotation symmetry are preferably used. The polygon substantially in rotation symmetry is preferably a substantially regular polygon, more preferably a substantially regular polygon having at least six angles and six sides. In a wire having such a cross section, the shape of a filament consisting essentially of an oxide superconducting material is preferably in the shape of a ribbon extending in the longitudinal direction of the wire. For example, a wire having a plurality of ribbon-shaped filament portions consisting essentially of an oxide superconducting material and extending in the longitudinal direction of the wire, and a stabilizing matrix covering the plurality of filament portions may be preferably used. In the wire, the aspect ratio of the ribbon-shaped filament, in other words, the ratio of the width to the thickness of the filament may be in the range from 4 to 40, preferably in the range from 4 to 20, more preferably in the range from 5 to 20. By forming a filament with such an aspect ratio, the c axes of crystal grains may be fully oriented, such that a wire having high critical current density may be obtained. The thickness of the filament may be in the range from 1 $\mu$m to 50 $\mu$m, and preferably in the range from 1 $\mu$m to 10 $\mu$m. In a filament having an aspect ratio in the range from 4 to 40 and a thickness in the range from 5 $\mu$m to 50 $\mu$m, the c axes of the crystal grains forming the superconducting phase may be oriented substantially perpendicularly to the longitudinal direction of the wire. The filament having values in such ranges may have a sufficient density and a high critical current density in a wire having a circular cross section or a polygonal cross section substantially in rotation symmetry. For the polygon in the rotation symmetry, a polygon having the rotating angle of not more than 90° with respect to the axis of symmetry is preferable, in other words a polygon of at least four-fold axis is more preferable. A wire having a circular or polygonal cross section and ribbon-shaped filaments may be manufactured by the powder-in-tube process in the following manner. Oxides or carbonates in powder of elements constituting a superconductor are mixed in a prescribed mixing ratio, followed by sintering, and a resulting sintered material is ground. The sintering and grinding are preferably performed a number of times. The resulting powder is filled in a tube composed of silver or a silver alloy. The tube filled with the powder is subjected to plastic working. The plastic working may include drawing, rolling, pressing and the like. The tube filled with the powder is for example subjected to drawing and rolling to obtain a tape-shaped wire. In the obtained tape-shaped wire, a portion of the material powder has a ribbon shape having an aspect ratio in the range from 4 to 40, preferably in the range from 4 to 20. The tape-shaped wire may be single-filamentary or multifilamentary. The obtained tape-shaped wire is generally cut into a plurality of wires. The obtained plurality of tape-shaped wires are filled in a tube of silver or a silver alloy. The filling step may include the steps of providing a prismatic stabilizing member having a cross section of a regular polygon, stacking the tape-shaped wires on each side surface of the stabilizing member and filling the member and the wires in the tube. The tape-shaped wire may be layered in a single or two or more layers upon each side surface of the prismatic stabilizing member. Alternatively, the filling step may include the steps of providing a sheet of the stabilizer, arranging a plurality of the tape-shaped wires on the sheet in parallel with each other, winding the sheet with the wires on a cylindrical stabilizer, and filling, in a cylindrical tube, the wires wound around the cylindrical stabilizer with the sheet. Alternatively, the filling step may include the steps of filling, in a tube, a plurality of tape-shaped wires gathered in layers, and then filling the gap in the tube with the tape-shaped wires in a direction different from the gathered tape-shaped wires, such that the wires are filled in the tube at a high filling density. The tube filled with the tape-shaped wires is subjected to plastic working, so that a wire having a cross section of an substantial circle or a polygon substantially in rotation symmetry is obtained. For the plastic working, drawing may be mainly employed. For the drawing, a driving roller dice may be used. The obtained wire may be subjected to the step of applying a paint or the step of plating a nonmagnetic metal according to the invention. Meanwhile, the obtained wire may be subjected to plastic working for the purpose of densifying the superconducting material, or to a heat-treatment for sintering and plastic working for densifying, followed by the step of applying the paint or the step of plating the nonmagnetic metal.

The present invention will be now described in more detail by referring to Examples.

EXAMPLES

Example 1

$Bi_2O_3$, PbO, $SrCO_3$, $CaCO_3$ and CuO in powder were mixed into the composition ratio of Bi: Pb: Sr: Ca: Cu=1.8:0.4:2:2:3. The obtained mixture was subjected to a heat-treatment for calcination and grinding three times to obtain a precursor of an oxide superconductor in powder. The obtained powder was filled in a silver pipe of an outer diameter of 15 mm and an inner diameter of 13 mm. The silver pipe filled with the powder is drawn to 1.02 mm$\phi$ and rolled into a thickness of 0. 2 mm to obtain a tape-shaped wire. The tape-shaped wires thus obtained were filled in a silver pipe having an outer diameter of 12 mm and an inner diameter of 10 mm in the arrangement as shown in FIG. 1. As shown in FIG. 1, 15 single-filamentary tape wires 2, layered upon each other are filled in the central part of silver pipe 1, and 3 single-filamentary tape wires 2, layered upon each other are filled on both sides thereof. Tape wires 2 on both sides are arranged substantially perpendicularly to tape wires 2 in the center. The silver pipe thus filled with the 21 tape wires was drawn to obtain a round wire having a diameter of 1.5 mm$\phi$. The obtained round wire was sintered at a temperature of 850° C., and then drawn to obtain a round wire having a diameter of 1.02 mm$\phi$.

Figure 2A:
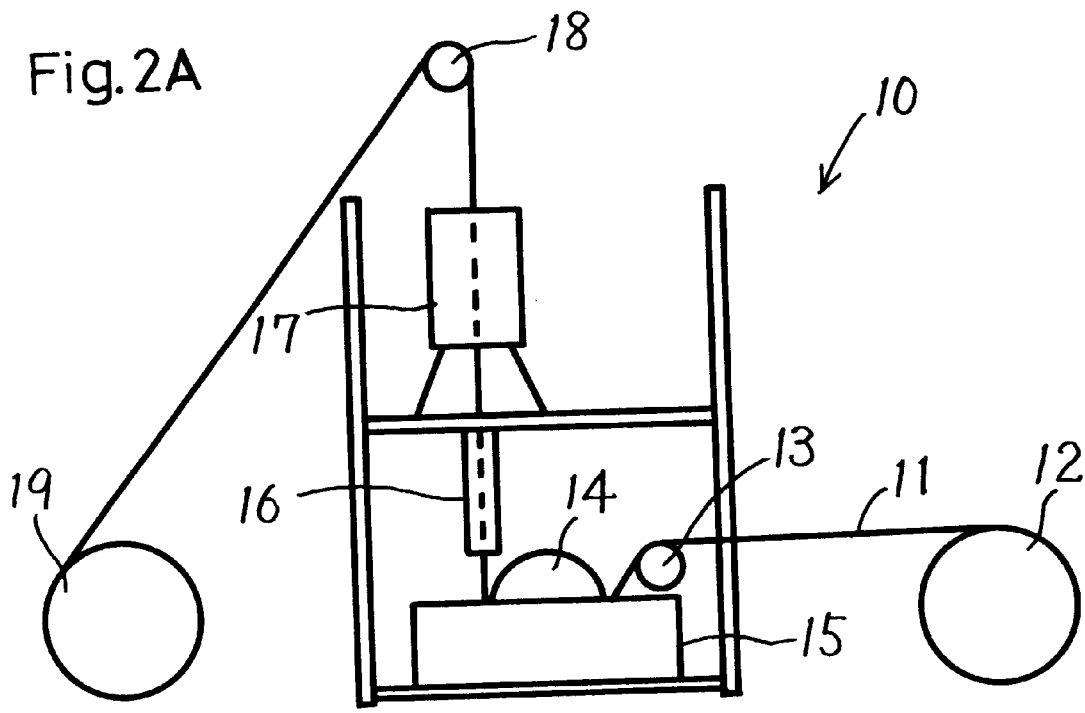
FIG. 2A is a schematic view showing equipment for forming a coating film on a wire according to the invention.

The obtained round wire is coated with a film using an equipment as shown in FIG. 2A. In coating film formation equipment 10 shown in FIG. 2A, a round wire 11 is supplied from a supply reel 12 and fed via a roller 13 to a paint reservoir 15 provided with a roller 14. The wire coated with the paint stored in reservoir 15 on roller 14 is sent to a pre-drying furnace 16 for drying. After the paint is dried in pre-drying furnace 16, the round wire is sent to a baking furnace 17, and the paint is baked therein. The round wire leaving baking furnace 17 is wound around a reel 19 via a roller 18. A commercially available solution-type silicone varnish containing silicone resin as a main component and a commercially available heat-resisting paint containing Tirano polymer as a main component were stored in paint reservoir 15 respectively, the round wire was coated with these paints respectively, dried and baked in the equipment as shown in FIG. 2A. The drying was performed at a temperature of about 100° C. and the baking was performed at a temperature of about 680° C. The round wire was fed at a speed of 3 m/min and each part of the round wire was passed through the drying furnace and baking furnace both for about five seconds. The wire having a coating film was cut into suitable lengths and three such obtained wires were twined and sintered at 850° C for 50 hours. In the stranded wire obtained after the sintering, the electric resistance between the strands was measured, and a resistance value of about 800 k$\Omega$ was obtained using any of the paints.

Example 2

A commercially available paint consisting of an aqueous solution of aluminum primary phosphate and the additives of a white pigment and a dispersing agent for the pigment was coated on samples of short round wires cut from the wire obtained according to Example 1, followed by drying at 100° C. for 10 minutes, and then a heat-treatment is performed at 700° C. for 10 minutes. The white coating immediately after applying the paint was changed into light yellow by the heat-treatment at 700° C., and a coating layer tightly adhering to-the round wire was obtained. When the round wire obtained after the heat-treatment at 700° C. was bent at a radius curvature of 10 mm$\phi$, the coating layer did not peel off. After another heat-treatment at 700° C. for 10 minutes, three round wires having a coating layer substantially converted into ceramic were twined and sintered for 50 hours at 850° C. Subsequently, the electrical resistance between the strands was measured and a resistance value of 3 M$\Omega$ was obtained.

Figure 2B:
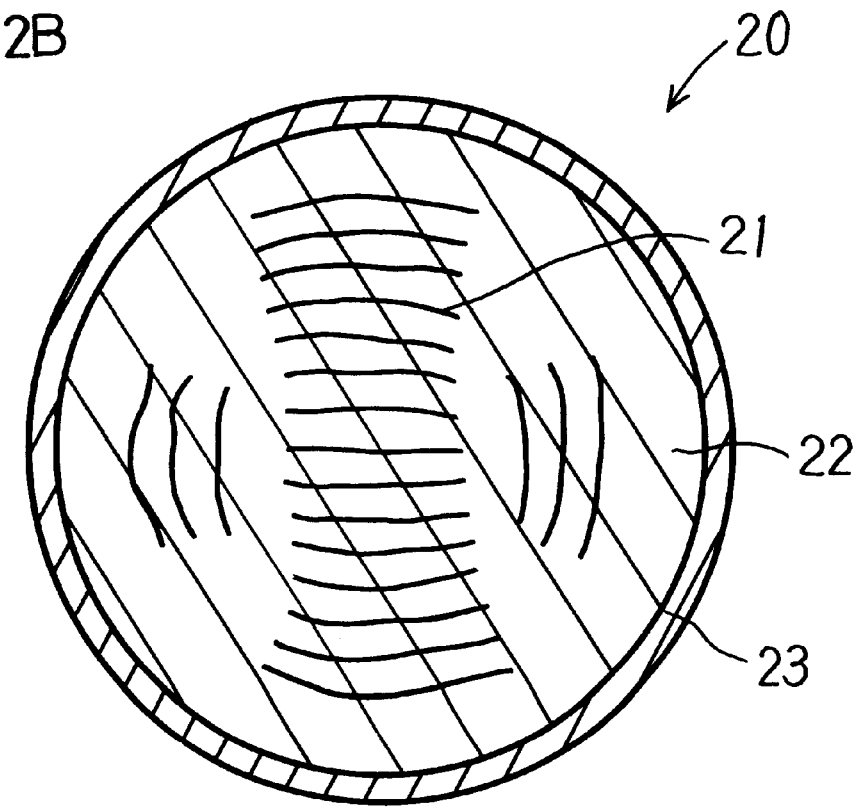
FIG. 2B is a schematic cross sectional view of a coated wire manufactured in Examples 1 and 2.

A cross section of the wire after the baking of the paints was finished according to Examples 1 and 2 is shown in FIG. 2B. In coated wire 20 having a circular cross section, filament portions 21 of the oxide superconducting material are arranged in a layered manner in silver stabilizing matrix 22. The thickness-wise direction of filament portions 21 is substantially perpendicular to the radial direction of the cross section of wire 20. Filament portion 21 has a ribbon shape. A coating layer 23 of the baked paint is provided around matrix 22.

Example 3

Similarly to Example 1, a round wire having a diameter of 1.02 mm$\phi$ is coated with commercially available solution-type silicone varnish containing silicone resin as a main component, followed by baking in the same equipment. The round wire of 1.02 mm$\phi$ used had a critical current (Ic) of 3A, when a heat-treatment was performed at 850° C. without the application of the paint. The wire provided with the coating film was cut into segments of an appropriate length, and six such round wires provided with the coating film were twined around a wire of silver into a primary stranded wire. Then, four such obtained primary stranded wire were twined into a secondary stranded wire.

After removing the insulating coating layer from the terminal portion of the obtained primary stranded wire, the terminal portion was once again stranded and subjected to a heat-treatment at 840° C. for 50 hours. The constitution of the obtained stranded wires are given in the following Table 1.

TABLE 1

Constitution of secondary stranded wire for conductor

| | |
|---|---|
| Primar stranding pitch (mm) | 50 mm |
| Primary stranding direction | s |
| Secondary stranding pitch (mm) | 100 mm |
| Secondary stranding direction | s |
| Number of strands | (6 + 1) × 4 |
| Average Ic (1 μV/cm) of stranded wire | 61A |

Figure 3:
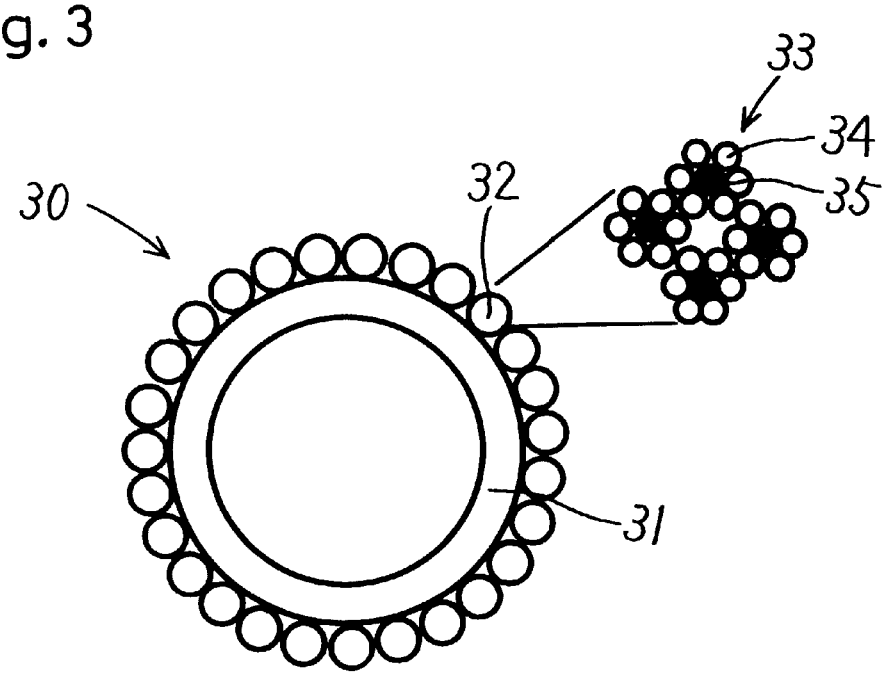
FIG. 3 is a schematic cross sectional view of a cable conductor according to the invention.

Twenty-seven such obtained stranded wires were integrated on a copper pipe to manufacture a cable conductor. The spiral pitch of the stranded wires in the cable conductor was 500 mm. The length of the terminal portion of the conductor removed of the insulating coating layer was 100 mm, which was the same as the pitch of the secondary stranded wire. A cross section of the obtained cable conductor is given in FIG. 3. In cable conductor 30, 27 secondary stranded wires 32 are provided in a single layer on cylindrical copper pipe 31. Secondary stranded wire 32 is formed by twining four primary stranded wires 33. Primary stranded wire 33 was formed by twining six round wires 34 having a coating film around a Ag round wire 35 at the center. The critical current of the obtained cable conductor was 1500A. Ac loss was measured for the obtained translocation-type cable conductor. For the purpose of comparison, a round wire of 1.02 mmφ obtained according to Example 1 was heat-treated at 850° C. for 50 hours without applying a paint to obtain a wire having a critical current of 3A, and 648 such obtained wires were provided around a cylindrical copper pipe in ten layers to manufacture a cable conductor. Interlayer insulation was performed by a Mylar tape. As a result, the ac loss in the 1 to 2 kA class cable conductor as shown in FIG. 3 was about 1/10 that of the cable conductor manufactured for comparison in an area equal to or lower than the critical current.

Example 4

Figure 4:
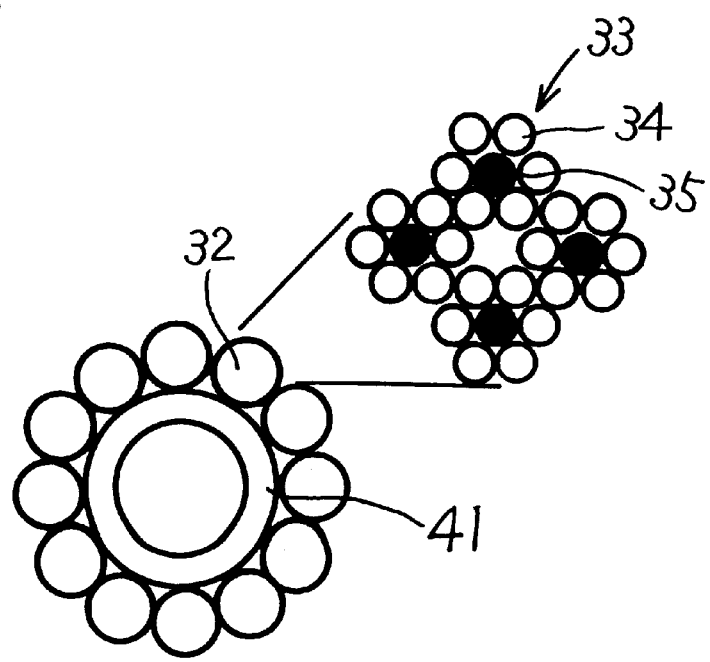
FIG. 4 is a schematic cross sectional view of a cable conductor according to the invention.

A secondary stranded wire of the constitution shown in Table 2 was manufactured. A round wire of a diameter of 1.02 mmφ manufactured according to Example 1 was used. As in the case of Example 1, commercially available silicone varnish containing silicone resin as a main component was applied, dried, and baked, and a round wire having a coating film was obtained. Six such round wires having a coating film were twined around a single silver wire at a prescribed pitch to manufacture a primary stranded wire. Four such obtained primary stranded wires were twined at a prescribed pitch to obtain a secondary stranded wire. Two kinds of stranded wires No. 1 and No. 2 having different stranding pitches shown in Table 2 were manufactured. In addition, a secondary stranded wire was similarly manufactured using a round wire of a diameter of 1.02 mmφ without applying a paint. More specifically, six stranded wires without a coating film were twined around a single silver wire to manufacture a primary stranded wire, and then such primary stranded wires were twined to manufacture a secondary stranded wire. The obtained secondary stranded wire is denoted as No. 3 in Table 2. These obtained secondary stranded wires No. 1 to No. 3 were processed at their terminal portions and subjected to a heat treatment at 840° C. for 50 hours. Twelve such secondary stranded wires for each of No. 1, No. 2 and No. 3 were provided around a copper pipe 41 straightforward in a single layer as shown in FIG. 4 to manufacture a cable conductor having a length of 1 m. Further, for the purpose of comparison, a round wire of a diameter of 1.02 mmφ was sintered at 850° C. for 50 hours without applying a paint, and 288 such obtained wires were provided around a copper pipe in four layers to manufacture a cable conductor having a length of 1 m. The critical current of each of the four kinds of conductors is 300A, the inner diameter of each of the conductors is 19 mmφ, and the outer diameter 27 mmφ. Ac loss was measured for these four kinds of conductors obtained. The ac loss was measured by the energization four-probe method at 51 Hz. The terminal portion of the conductor was soldered for a length of 10 cm. The measured ac current loss is also given in Table 2. As clearly shown in Table 2, the ac loss can be reduced by employing the stranded wires. The loss significantly decreases by insulating between the strands. In order to obtain the effect of reducing the ac current loss, it is important that the length of the terminal portion removed of the insulating coating is longer than the pitch of the stranded wire.

TABLE 2

| | No. 1 | No. 2 | No. 3 | No. 4 |
|---|---|---|---|---|
| Primary stranding pitch | 80 mm | 40 mm | 40 mm | No stranding |
| Secondary stranding pitch | 150 mm | 80 mm | 80 mm | |
| Inter-strand insulation | Silicone resin | Silicone resin | none | none |
| Ac loss (W/m) at 100 Arms | 0.008 | 0.005 | 0.0085 | 0.02 |

Example 5

Figure 5:
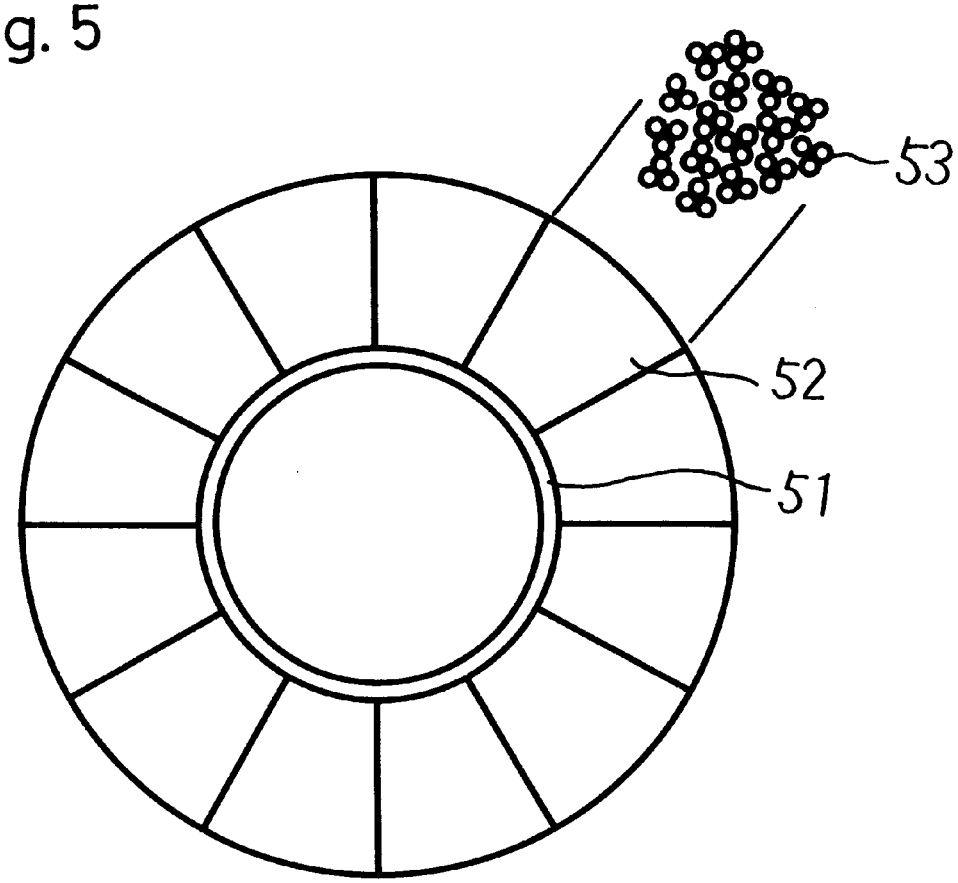
FIG. 5 is a schematic cross sectional view of another cable conductor according to the invention.

A round wire the same as the round wire obtained according to Example 1 was drawn to 0.8 mmφ, then heat-treated at 850° C. for 50 hours, and drawn to 0.7 mmφ by one pass through the dice. The obtained wire was coated with a paint of silicone resin, dried at 120° C., and baked at 680° C. Three such wires having a coating film were twined to manufacture a stranded wire. Four such obtained primary stranded wires were twined into a secondary strand wire, and four such secondary stranded wires were further twined into a tertiary stranded wire. At the time of tertiary stranding, the strands were passed through a shaping roll to make a cross section of the tertiary stranded wire sectoral. The shaped tertiary stranded wire was sintered at 840° C. for 50 hours. Twelve such shaped tertiary stranded wires were provided on a copper pipe having an outer diameter of 19 mmφ and an inner diameter of 18 mmφ to obtain a cable conductor. The structure of the obtained cable conductor is shown in FIG. 5. Twelve tertiary stranded wires 52 each having a cross section shaped into a sectoral form were cylindrically arranged on a copper pipe 51. Tertiary stranded wires 52 were produced by twining 3×4×4 the round wires 53. The critical current (Ic) of the obtained conductor was 3100A.

Example 6

In the same steps as those in Example 1, a wire which has been drawn to 1.15 mm before sintering was further drawn to φ0.9 mm, coated with commercially available silicone varnish of a solution type containing silicone resin as a main component, and baked in the same process as that in Example 1. The obtained wire having a coating film was cut into segments of an appropriate length, then six such obtained round wires were twined, and passed through a shaping roll immediately thereafter to be shaped into a flat form. The obtained stranded wire has a width of 4 mm and a thickness of 1.5 mm. The obtained stranded wire was subjected to a heat-treatment for at 850° C. 50 hours, then to plastic working using a roller, and to a heat-treatment at 850° C. for 50 hours. The critical current (Ic) of the obtained stranded wire was 15A.

The ac loss in the stranded wire after removing the insulating coating at the terminal portion and voltage terminal portion of the obtained stranded wire was measured in liquid nitrogen by the ac four-probe method. The measurement result demonstrated that the ac loss by the application of current was smaller than the amount of loss estimated according to the theoretical formula (Norrish formula). The result shows that the current drift phenomenon was restrained by twining the wires.

Example 7

By the same steps as those in Example 1, a wire which has been drawn to $\phi 1.15$ mm before sintering was further drawn to $\phi 0.9$ mm, coated with commercially available silicone varnish of a solution type containing silicone resin as a main component, and baked in the same process as that according to Example 1. The formed wire having a coating film was cut into segments of an appropriate length, and thus obtained six round wires were twined around a silver wire to manufacture a primary stranded wire. Furthermore, four such obtained primary stranded wires were twined and passed through shaping roll immediately thereafter to be shaped into a flat form. The obtained flat-shaped stranded wire has a width of 8 mm and a thickness of 3 mm. The obtained stranded wire was subjected to a heat-treatment at 850° C. for 50 hours, then to plastic working using a roller, and to a heat-treatment at 840° C. for 50 hours. The critical current of the obtained stranded wire was 50A.

The ac loss in the stranded wire after removing the insulation coating at the terminal portion and voltage terminal portion of the obtained stranded wire was measured in liquid nitrogen by the ac 4-probe method. The measurement result shows that the ac loss by energization was smaller than the amount of loss estimated based on the theoretical formula (Norish formula) for the superconductor having a critical current of 50A. This result shows that the current drift phenomenon was restrained by twining the wires.

Example 8

In the same steps as those in Example 1, a round wire was drawn to $\phi 1.02$ mm and subjected to a heat-treatment at 850° C. for 50 hours, and then drawn to $\phi 0.9$ mm. Commercially available silicone varnish of a solution type containing silicone resin as a main component was applied and baked in the same process as that in Example 1. The obtained wire having a coating film was cut into segments of an appropriate length and six such round wires were twined and passed through a shaping roll immediately thereafter to be shaped into a flat form. The obtained stranded wire has a width of 4 mm and a thickness of 1.5 mm. The obtained stranded wire was subjected to a heat-treatment at 840° C. for 50 hours. The critical current of the obtained stranded wire was 15A.

After removing the insulation coating at the terminal portion and voltage terminal portion of the obtained stranded wire, the ac losses in the stranded wire was measured in liquid nitrogen using the ac 4-brobe method. The measurement result demonstrated that the ac loss by energization was smaller than the amount of the loss estimated based on the theoretical formula (Norish formula) for the superconductor having a critical current of 15A. This result shows that the current drift phenomenon was restrained by twining the wires.

Example 9

By the same steps as those in Example 1, a round wire was drawn to $\phi 1.02$ mm and heat-treated at 850° C. for 50 hours. Subsequently, the wire was drawn to $\phi 0.9$ mm and coated with commercially available silicone varnish of a solution type containing silicone resin as a main component, and baked in the same process as that in first embodiment. The obtained wire having a coating film was cut into segments of an appropriate length, and six such round wires were twined on a silver wire to manufacture a primary stranded wire. Then, four such primary wires were twined, passed through a shaping roll immediately thereafter to be shaped into a flat form. The obtained flat-shaped stranded wire has a width of 8 mm and a thickness of 3 mm. The obtained stranded wire is heat-treated at 840° C. for 50 hours. The critical current of the obtained stranded wire was 50A.

After removing the insulation coating at the terminal portion and voltage terminal portion of the obtained stranded wire, the ac loss in the stranded wire was measured in liquid nitrogen by the ac four-probe method. The measurement result demonstrated that the ac loss by energization was smaller than the amount of loss estimated based on the theoretical formula (Norish formula) for the superconductor having a critical current of 50A. This result shows that the current drift phenomenon was restrained by twining the wires.

Figure 11:
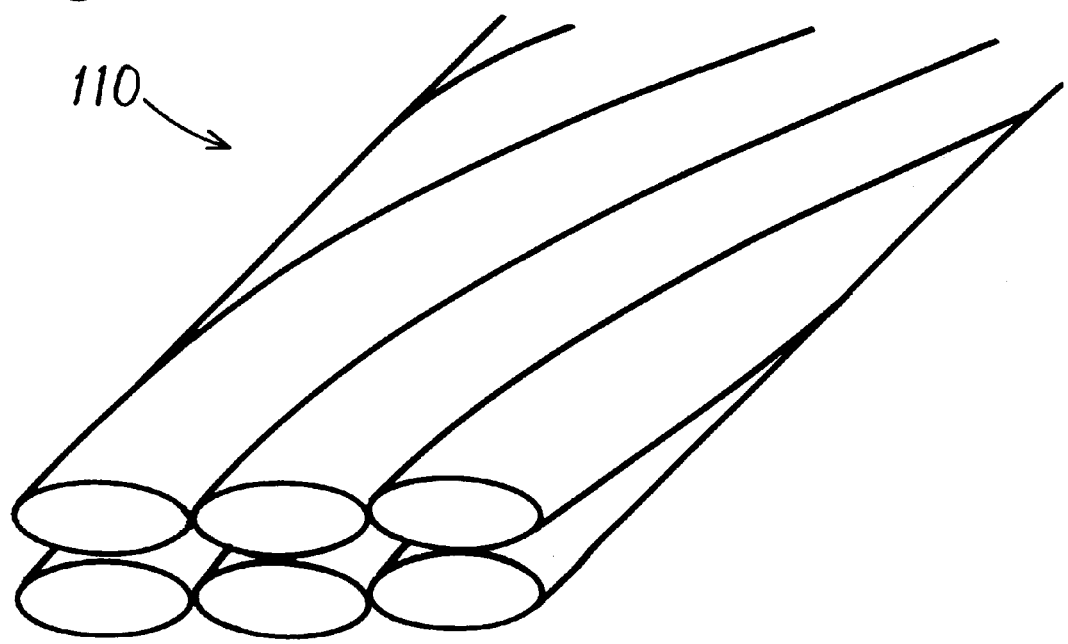
FIG. 11 is a schematic perspective view showing an example of a stranded wire according to the present invention.

An example of a flat-shaped stranded wire obtained according to the present invention is shown in FIG. 11. Flat-shaped stranded wire 110 consists of six strands. A cross section of each of the strands is flattened at the time of shaping the stranded wire.

Example 10

The stranded wires manufactured in Examples 6 to 9 were spirally wound around a former respectively and appreciated for the resulting conductor. The distribution of the ac current was analyzed ,when the stranded wires was spirally wound around a cylindrical former having a diameter of $\phi 18$ mm in a plurality of layers.

The analysis proceeded as follows.

(1) The modeling of the multi-layer cable conductor is carried out to derive the impedance of each layer.
(2) A circuit conditional equation is established based on the derived result.
(3) A pitch necessary for uniform current distribution among is obtained by solving the equation under the conditions where the current of each layer is equal.

Figure 12:
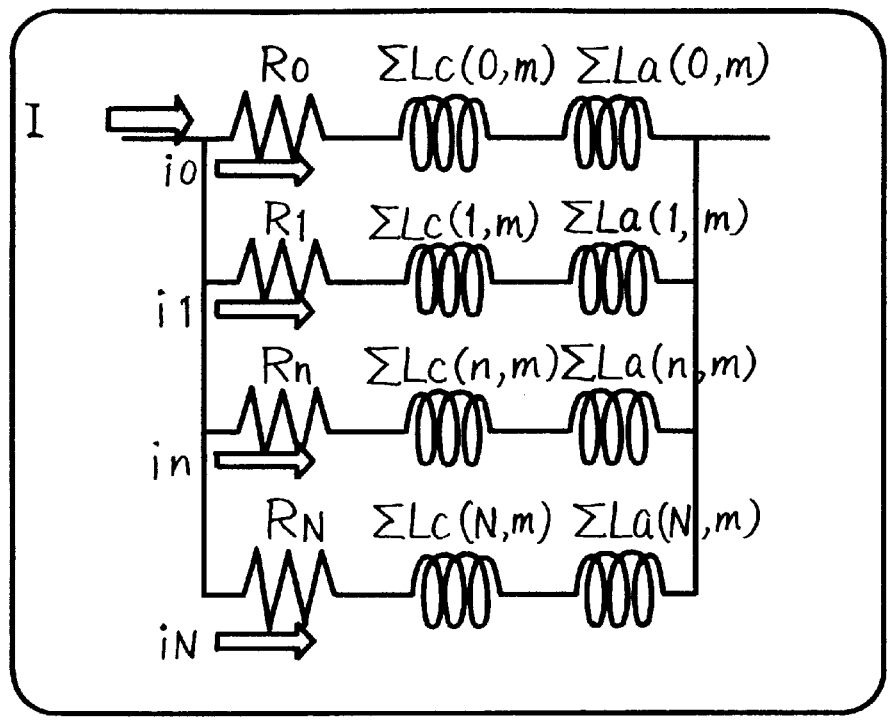
FIG. 12 is a diagram showing a circuit model for an N-layer conductor.

If the conductor is so long that the impedance of the terminal may be ignored, the modeling as shown in FIG. 12 may be made on an N-layer conductor. In FIG. 12, N represents the total number of the layers, and n and m both represent the ordinal number of layers counted from the former. Characters in and Rn represent current and resistance components through the n-th layer, and n=0 corresponds to the former.

Figure 13:
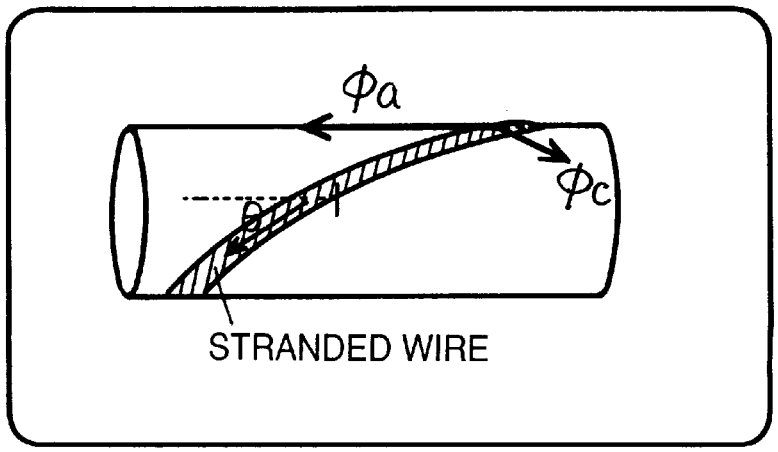
FIG. 13 is a schematic diagram showing a model for the directions of a magnetic field and a current in a cable conductor.

The n-th layer (n≠0) is formed by spirally wound stranded wires as shown in FIG. 13. If the winding angle is θn, current in passed through the n-th layer may be divided into the circumferential current component in·sin θn and the axial current component in·cos θn. The inductance by a circumferential magnetic field $\phi c$ at this time is defined as Lc (n, m), and the inductance by an axial magnetic field $\phi a$ is defined as La (n, m). Herein, if n=m, the self-inductance of the n-layer is represented, and if n≠m, the mutual inductance between the n-th layer and the m-th layer is represented.

The inductances Lc (n, m) and La (n, m) of the n-th layer in the N-layer conductor having a length of $\lambda$ are represented by Expressions (1) and (2), respectively as follows. The parameters of conductors used in the expressions are given in Table 3. In Expression (2), La>0 corresponds to the case where the m-th layer and n-th layer are wound in the same direction, while La<0 corresponds to the case where the m-th layer and n-th layer are wound in the opposite directions.

$$L_c(n, m) = \frac{\mu_0 \lambda \cos\theta_m}{2\pi} \ln\left(\frac{a_s}{a_{max}}\right) \quad (1)$$

Expression (3)

$$\begin{pmatrix} V \\ V \\ \vdots \\ V \\ \vdots \\ V \end{pmatrix} = \begin{pmatrix} R_0 + j\omega L_c(0,0) & \ldots j\omega L_c(0,n) & \ldots j\omega L_c(0,N) \\ j\omega L_c(1,0) & \ldots j\omega\{L_c(1,n)+L_a(1,n)\} & \ldots j\omega\{L_c(1,N)+L_a(1,N)\} \\ \vdots & \ldots & \vdots \\ j\omega L_c(n,0) & \ldots R_n + j\omega\{L_c(n,n)+L_a(n,n)\} & \ldots j\omega\{L_c(n,N)+L_a(n,N)\} \\ \vdots & \ldots & \vdots \\ j\omega L_c(N,0) & \ldots j\omega\{L_c(N,n)+L_a(n,n)\} & \ldots R_N j\omega\{L_c(N,N)+L_a(N,N)\} \end{pmatrix} \begin{pmatrix} i_0 \\ i_1 \\ \vdots \\ i_n \\ \vdots \\ i_N \end{pmatrix} \quad (3)$$

smaller than the diameter of the conductor. A shield layer is provided as the outermost layer.

If current supplied from a power supply is I (I=Σin), and voltage generated across the conductor is V, in a multi-layer conductor having the constitution in Table 3, Expression (3) is established.

Herein, the following assumption was made.
(1) The resistance component of the superconducting layer is sufficiently small.
(2) The impedance of the former is sufficiently larger than the impedance of the superconducting layer.

The conditions where the current of each layer is equal based on the above (1) and (2) were calculated according to Expression 3. According to Expression (3), the conditions for the winding pitch to equalize the current of each layer in a two-layer conductor were obtained. The result shows that if the pitches of the first and second layers are the same, the current passed through the first and second layers cannot be completely equalized. Then, the way of equalizing the current of each layer by adjusting the pitch was considered. In this case, the following Expression (4) is established.

Expression (4)

$$\begin{pmatrix} V \\ \vdots \\ V \\ \vdots \\ V \end{pmatrix} = \begin{pmatrix} j\omega\{L_c(1,1)+L_a(1,1)\} & \ldots j\omega\{L_c(1,n)+L_a(1,n)\} & \ldots j\omega\{L_c(1,N)+L_a(1,N)\} \\ \vdots & \ldots & \vdots \\ j\omega\{L_c(n,1)+L_a(n,1)\} & \ldots j\omega\{L_c(n,n)+L_a(n,n)\} & \ldots j\omega\{L_c(n,N)+L_a(n,N)\} \\ \vdots & \ldots & \vdots \\ j\omega\{L_c(N,1)+L_a(N,1)\} & \ldots j\omega\{L_c(N,n)+L_a(n,n)\} & \ldots j\omega\{L_c(N,N)+L_a(N,N)\} \end{pmatrix} \begin{pmatrix} i_1 \\ \vdots \\ i_1 \\ \vdots \\ i_1 \end{pmatrix} \quad (4)$$

-continued $$a_{max} = \max(a_n, a_m)$$

$$L_a(n, m) = (-1)^{m+n} \sin\theta_m \frac{\mu_0 \pi a_{min}^2 \lambda}{Pn\, Pm} \quad (2)$$

$$a_{min} = \min(a_n, a_m)$$

The analysis was made as to conductors of the constitutions given in the following Table 4.

TABLE 4

Constitutions of conductors for calculation

| | Number of layers | Winding direction | Inner diameter | Outer diameter | Shield radius |
|---|---|---|---|---|---|
| No. 1 | 2 | alternate | φ 18 mm | conductor diam. as obtained by making all the layers | φ 40 mm |
| No. 2 | 2 | same | | | |
| No. 3 | 3 | alternate | | | |
| No. 4 | 10 | same | | | |

TABLE 3

Conductor parameters

| | subscript | pitch(m) | winding angle | avg. radius(m) | current(A) |
|---|---|---|---|---|---|
| Former | 0 | ∞ | 0 | ao | io |
| Super-conducting layer(n-th layer) | n | Pn | θn | an | in |
| Shield layer | s | — | — | as | Σik |

In each layer of the conductor, a plurality of stranded wires are spirally wound at a pitch of Pn and a winding angle of θn, and the thickness of each of the layers is sufficiently As a result of a calculation about conductor No. 1 in Table 4, when the pitch in the first layer is set in the range from 100 mm to 1000 mm, the pitch in the second layer is analytically solved in the entire region. If, for example, the pitch in the first layer is 200 mm, the pitch in the second layer necessary for equalizing the current is 110 mm. In addition, it has been found that in any of the cases, the pitch in the second layer necessary for equalizing the current was smaller than the pitch in the first layer.

As a result of a calculation about conductor No. 2 in Table 4, if the pitch in the first layer is set in the range from 100 mm to 1000 mm, the pitch in the second layer is analytically solved in the entire region. If, for example, the pitch in the first layer is 200 mm, the pitch in the second layer necessary for equalizing the current is 100 mm. It has been found that in any of the cases, the pitch in the second layer necessary for equalizing the current was smaller than the pitch in the first layer.

Note, however, if the sums of the impedances were compared between conductors No. 1 and No. 2, the impedance of conductor No. 1 was always smaller. This is because when the stranded wires are wound alternately, the mutual inductance in the axial direction is negative, while when wound in the same direction, it takes a positive value. This result shows that as to the direction of winding stranded wires in a multi-layer conductor, the number of layer(s) wound left-handedly and the number of layer(s) wound right-handedly are advantageously equalized.

As a result of calculating about conductor No. 3 in Table 4, when the pitch in the first layer is set in the range from 100 mm to 1000 mm, the pitch for completely equalizing the current in each layer could not be solved analytically for pitches of 400 mm or greater.

As to conductor No. 4 in Table 4, if the pitch in the first layer is set in the range from 100 mm to 1000 mm, the pitch for completely equalizing the current in each layer could not be analytically solved in the entire region. As a result, as the number of layers increased, the variation for equalizing the current was narrowed. It has been found that a two-layer conductor enables the most flexible designing.

Figure 14:
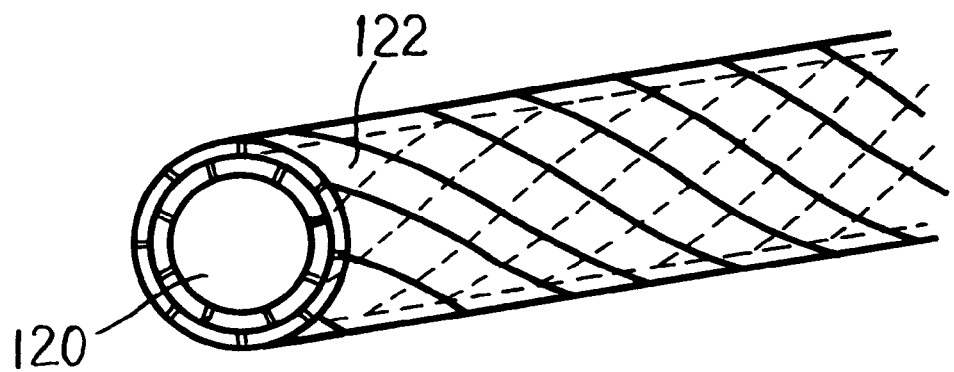
FIG. 14 is a schematic perspective view showing one example of a two-layer conductor according to the present invention.
Figure 15:
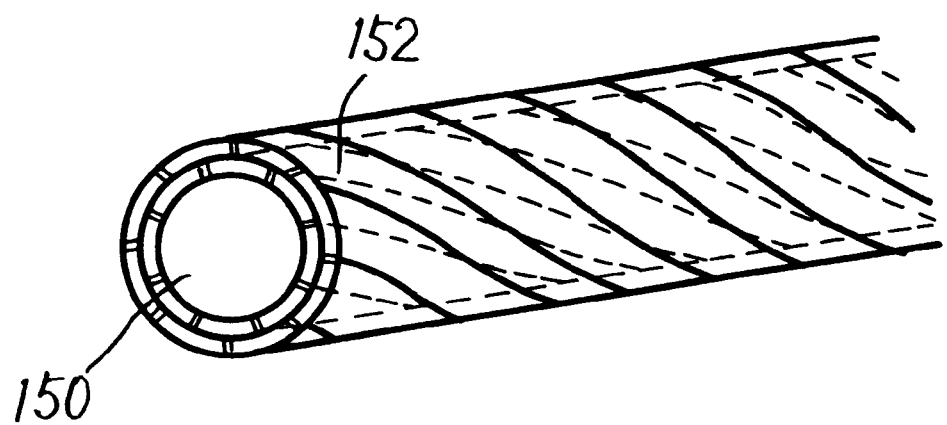
FIG. 15 is a schematic perspective view showing another example of a two-layer conductor according to the present invention.

FIG. 14 schematically shows the structure of a two-layer conductor according to the present invention. Stranded wires 122 is spirally wound around a cylindrical former 120 in two layers. In the conductor shown herein, the direction of winding in the first layer is opposite to the direction of winding in the second layer. The winding pitch in the second layer is shorter than the winding pitch in the first layer. In a two-layer conductor shown in FIG. 15, the direction of winding stranded wires 152 around a former 150 is the same between the first and second layers. The winding pitch in the second layer is shorter than the winding pitch in the first layer. These conductors may further be provided with a shield layer. A superconducting wire, a copper pipe or the like may be used for the shield layer to pass a shield current therethrough.

Example 11

By the same steps as those in Example 9, a flat-shaped stranded wire having a width of 8 mm and a thickness of 3 mm was manufactured. Another flat-shaped stranded wire without insulation coating on the strands was also manufactured for the purpose of comparison. These stranded wires were each spirally wound around a former to manufacture a two-layer conductor as long as 1.5 m having the constitution of conductor No. 2 in Table 4. As a result of measuring the Ic of the manufactured conductor, the Ic of the conductor provided with insulation was 300A. Meanwhile, the Ic of the conductor without insulation was not higher than 10A. In the case of the conductor without insulation, it was considered that diffusion coupling was caused among the strands by heat treatment after the twining process, which reduced the flexibility between the strands so that Ic was lowered. This clearly shows that the insulation coating for the strands is advantageous in manufacturing a cable conductor by integrating stranded wires.

As to a conductor manufactured using the stranded wires having insulation coating as described above, after removing the insulation coating at the terminal portion and voltage terminal portion of the stranded wire, the ac loss of the stranded wire was measured in liquid nitrogen using the ac 4-probe method. The measurement result demonstrated that the ac loss by energization was smaller than the amount of loss estimated based on the theoretical formula (Norrish formula) for the cylindrical superconducting conductor having a critical current of 300A. This result shows that the current drift phenomenon was restrained by adjusting the spiral pitch of the stranded wire in the conductor.

In order to confirm that the currents in the first and second layers were equalized by adjusting the spiral pitch of the stranded wire, the terminal of the conductor was adapted to allow current to pass through the first and second layers independently from each other, and the amount of current passed through each of the layers was examined by Rogowskii coil attached to the terminal portion. As a result, it was confirmed that current passed through the first and second layers was substantially equal.

Example 12

By the same steps as those in Example 1, powder was filled in a silver pipe, and tape-shaped wires were obtained through drawing and rolling. The obtained tape-shaped wires were filled in a silver pipe having an outer diameter of 12 mm and an inner diameter of 10 mm. Fifteen tape-shaped wires stacked upon each other were filled into the central part of the silver pipe, as in the case of Example 1. Silver tapes were filled in the gaps on both sides in place of the powder filled tape-shaped wires. The filled silver pipe was drawn to $\phi 1.02$ mm, and heat-treated at 850° C. for 50 hours. Then, drawing to $\phi 0.9$ mm was performed and the resultant round wire was coated with commercially available silicone varnish of a solution type containing silicone resin as a main component, followed by baking in the same process as that in Example 1. Subsequently, the wire having a coating film was cut into segments of an appropriate length, six such round wires were twined and passed through a shaping roll immediately thereafter to be shaped into a flat form. The obtained flat-shaped stranded wire has a width of 4 mm and a thickness of 1.5 mm.

Two kinds of stranded wires, in other words, a stranded wire produced while adjusting the number of revolutions of the wire supply portion in the above twining step and a stranded wire without such adjustment were manufactured. In the adjustment, the bobbin was turned around one time at the time of winding 1 pitch for twining back adjustment. By the adjustment of the number of revolutions, the directions of longer axes of cross sections of the superconducting filaments in the obtained stranded wire after shaping were aligned substantially in the same direction. By winding such a stranded wire around a former, a cable conductor (type 1) in which the longer axes of filament cross sections were aligned in the circumferential direction of the former was obtained. Meanwhile, if the adjustment of the number of revolutions was not performed at the time of twining wires, the longer axes of cross sections of the superconducting filaments were substantially random. By winding such a stranded wire around a former, a conductor (type 2) in which the longer axes of filament cross sections were substantially random relative to the circumferential direction of the former was obtained. The stranded wires of these two kinds were each integrated on a former of $\phi 18$ mm to manufacture a single layer conductor. The Ic of the conductor was 120A for type 1, and 100A for type 2. A sample of a length of 5 cm was cut from each of the stranded wires used for the conductors and examined for the Jc-B characteristic in liquid nitrogen. As a result, when a magnetic field of 100 Gauss was applied parallel to the main surface of the flat-shaped stranded wire, the Jc of the stranded wire used in type 1 was not substantially lowered as compared to the case without applying a magnetic field, while in the stranded wire used in type 2, Ic was lowered by about 50% by the influence of the magnetic field applied. No significant difference was observed in Ic between the obtained two kinds of single-layer conductors. However, the result of the Jc-B characteristic shows that when a conductor with an increased capacity generates an increased self-magnetic field by energization, the structure of type 1 is more advantageous, because Ic is less reduced by the self-magnetic field in type 1.

Example 13

Similarly to Example 1, a round wire having a diameter of 1.02 mm was prepared. The surface of the obtained round wire was plated with copper as thick as about 1 $\mu$m, 5 $\mu$m, 10 $\mu$m and 20 $\mu$m. A copper sulfate aqueous solution was used for the plating. The round wire and the copper plate were immersed in the aqueous copper sulfate solution, and electroplating was carried out using the round wire as the cathode and the copper plate as the anode. The electroplating solution contained 220 g/l of copper sulfate hydrate, 60 g/l of sulfuric acid and 2 ml/l of 35 % hydrochloric acid. In the electroplating, 2 A of current was applied ,and the distance between the electrodes was 3 cm.

Figure 16:
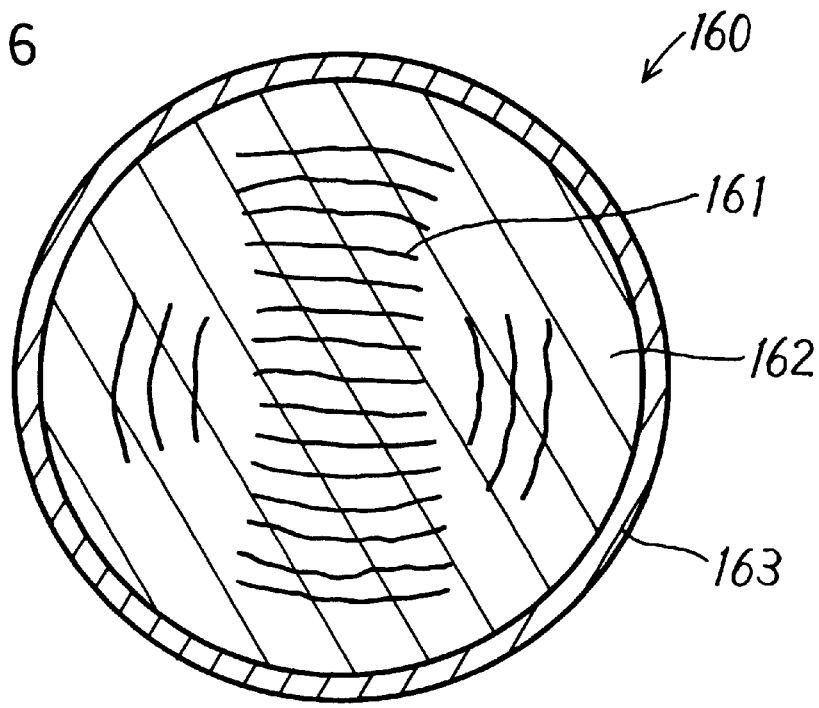
FIG. 16 is a schematic cross sectional view of a coating wire manufactured in Example 13.

FIG. 16 shows a cross section of the wire after the electroplating. In a coated wire 160 having a circular cross section, filament portions 161 of an oxide superconducting material were arranged in layers in a silver stabilizing matrix 162. The thickness-wise direction of filament portions 161 is substantially perpendicular to the radial direction of the cross section of wire 160. Filament portion 161 has a ribbon shape. A copper plating layer 163 is provided around matrix 162.

As to the above respective thicknesses, three round wires plated with copper were prepared and twined into a primary stranded wire. The obtained stranded wire was heated at 400° C. for 1 hour in the air. This heating converted the plated copper into copper oxide. Subsequently, the stranded wire was moved into a furnace for sintering and subjected to a heat treatment at 840° C. for 50 hours. The critical current (Ic) and insulation resistance of the sintered stranded wire were measured. Ic was measured in liquid nitrogen and defined as a value at 1 $\mu$V/cm. In the measurement of the insulation resistance, a voltage of 250V was applied to the stranded wire, and the electrical resistance across the region between the terminal provided at the portion of one strand removed of an oxide coating film and the terminal provided on the oxide coating film was measured. The distance between these terminals was 2 cm. The result is given in Table 5. As given in Table 5, when the thickness of the copper oxide film on the strand is not less than 10 $\mu$m, a resistance at the 50 k$\Omega$ level was stably obtained. The oxide copper film having a resistance value at this level can sufficiently function to prevent communication between the strands.

TABLE 5

| Thickness of copper oxide film ($\mu$m) | Ic(A) | Insulation resistance value($\Omega$) |
| --- | --- | --- |
| 1 | 2.0 | 500 |
| 5 | 1.5 | 1k |
| 10 | 2.0 | 50k |
| 20 | 2.0 | 50k |

TABLE 5-continued

| Thickness of copper oxide film ($\mu$m) | Ic(A) | Insulation resistance value($\Omega$) |
| --- | --- | --- |
| Control (without copper oxide film) | 2A class | — |

Figure 17:
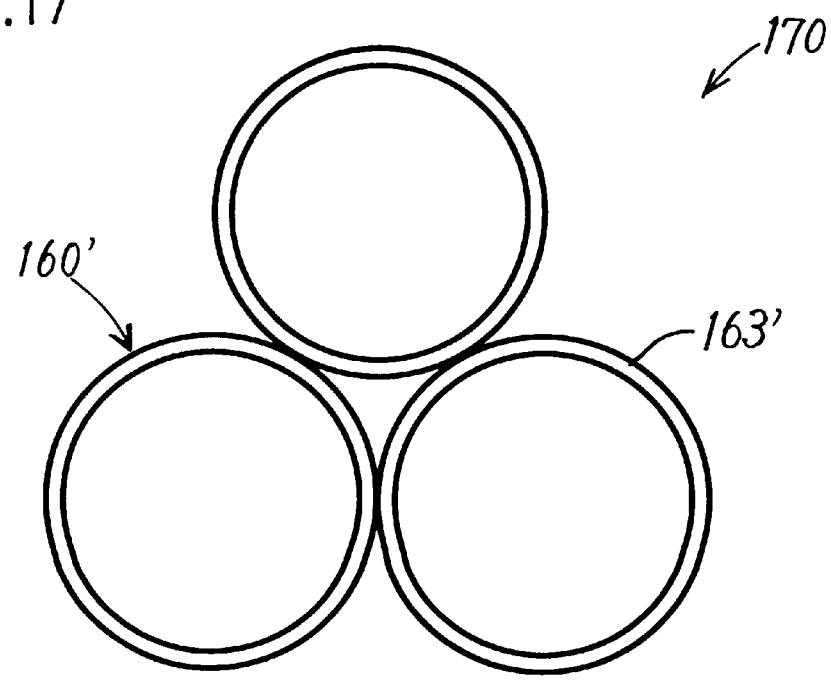
FIG. 17 is a schematic cross sectional view of a primary stranded wire manufactured in Example 13.

A cross section of the obtained stranded wire is given in FIG. 17. A primary stranded wire 170 is formed by three strands 160'. The conducting portion of each of these strands 160' is covered with a copper oxide film 163'.

Example 14

Five primary stranded wires according to Example 13 were twined into a secondary stranded wire. A pair of such secondary stranded wires was manufactured, one of the pair was shaped to have a flat-shaped cross section and the other was shaped to have a sectoral cross section. These two kinds of shaped secondary stranded wires were heated for sintering at 850° C. for 50 hours. The Ic of the flat-shaped secondary stranded wire was 25A, while the Ic of the sectoral secondary stranded wire was 25A.

Figure 18A:
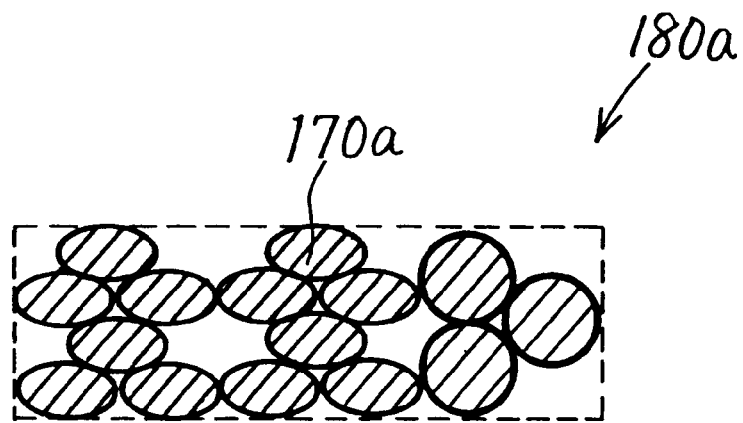
FIG. 18A is a schematic cross sectional view of a flat-shaped secondary stranded wire manufactured in Example 14.
Figure 18B:
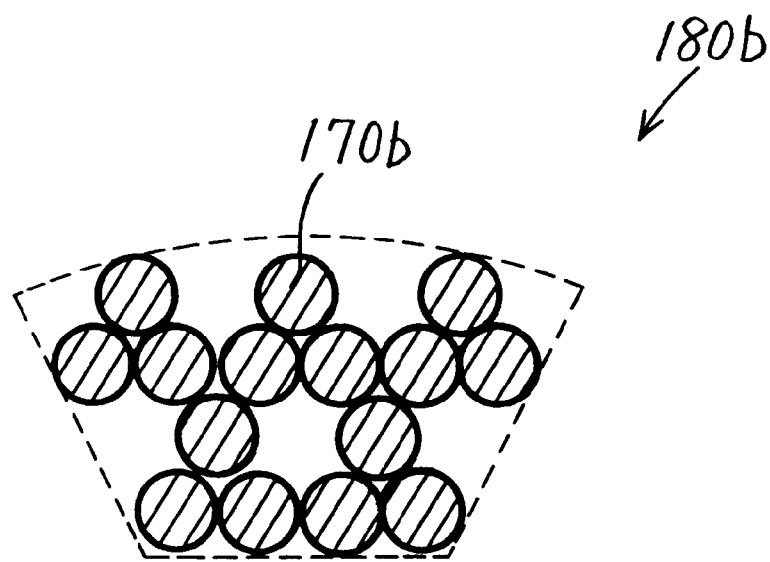
FIG. 18B-is a schematic cross sectional view of a sectoral secondary stranded wire manufactured in Example 14.

The structures of these two kinds of obtained stranded wires were given in FIGS. 18A and 18B. A secondary stranded wire 180a is formed by 5 primary stranded wires 170a and has a flat-shaped cross section. A secondary stranded wire 180b is formed by 5 primary stranded wires 170b and has a sectoral cross section.

Example 15

The two kinds of shaped secondary stranded wires obtained according to Example 14 were spirally wound around a cylindrical former of FRP having a diameter of 20 mm in a single layer to manufacture a cable conductor. In both conductors, the winding pitch was 200 mm. The number of the stranded wires wound was 5 and 6 in the conductors with the flat-shaped stranded wires and with the sectoral stranded wires respectively. The Ic of the cable conductor obtained using the flat-shaped stranded wires was 100A, and the Ic of the cable conductor obtained using the sectoral stranded wires was 120A. The use of the sectoral stranded wire in the cable conductors increased the filling ratio and the Ic.

Figure 19A:
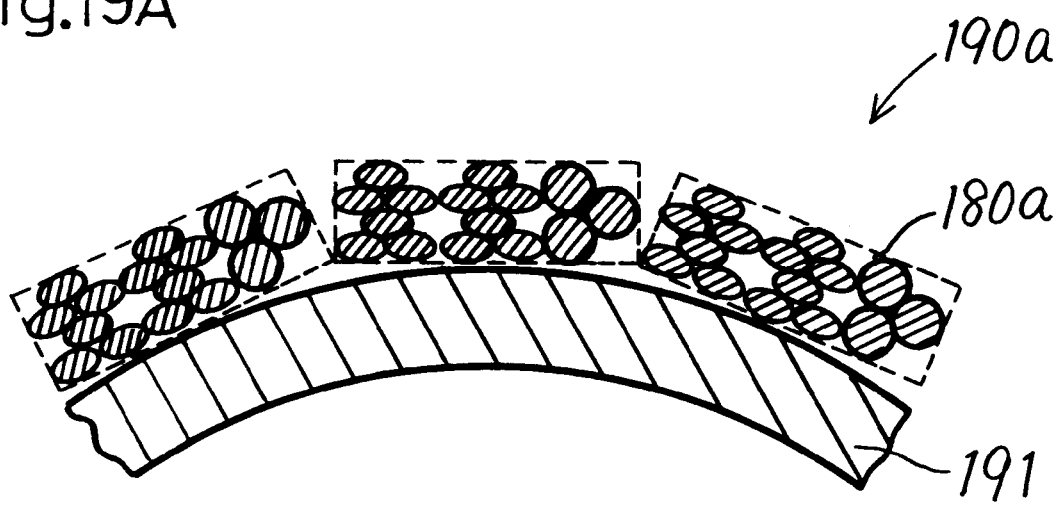
FIGS. 19A and 19B are schematic cross sectional views showing cable conductors manufactured in Example 15.
Figure 19B:
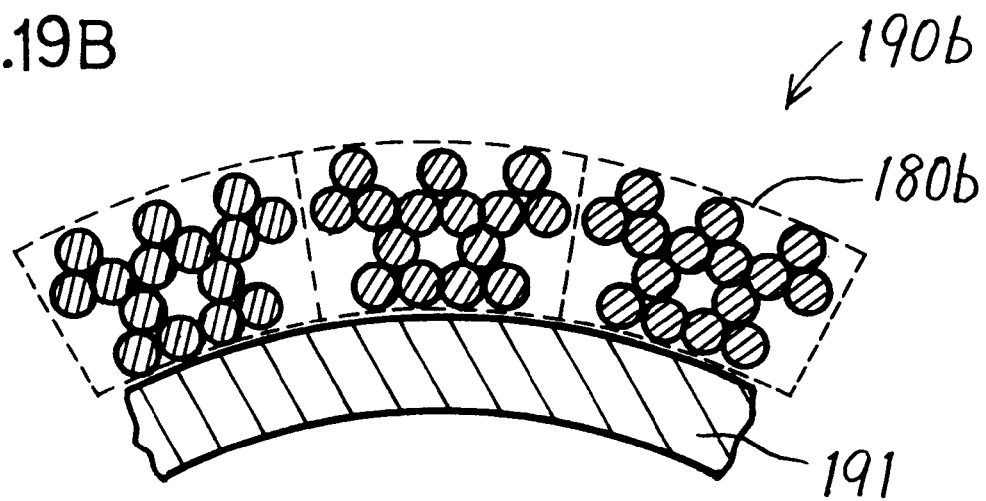

A part of the structures of these obtained two kinds of conductors is given in FIGS. 19A and 19B. In a cable conductor 190a, flat-shaped secondary stranded wires 180a are arranged on a former 191 in a single layer. In a cable conductor 190b, sectoral secondary stranded wires 180b are arranged on former 191 in a single layer.

Example 16

Similarly to Example 13, a round wire of a diameter of 1.02 mm was plated with copper as thick as about 20 $\mu$m. Six such copper-plated round wires were twined around a silver wire to obtain a primary stranded wire. The obtained stranded wire was heated at 400° C. for 1 hour in the air and a copper oxide film as thick as about 20 $\mu$m was produced. Subsequently, the stranded wire was heated at 850° C. for 50 hours for sintering. Four such sintered primary stranded wires were prepared in the above-described manner and twined into a secondary stranded wire. The obtained secondary stranded wire was shaped into a flat-shaped stranded wire having a width of 8 mm and a thickness of 3 mm, and heated at 850° C. for 50 hours for sintering. A plurality of thus obtained flat-shaped secondary stranded wires were used to manufacture a two-layer conductor as long as 1.5 m having the constitution of No.1 in Table 4. The obtained conductor is removed of the copper oxide film at the terminals of the stranded wires, copper terminals were soldered at the terminals, and current passed through each layer was measured using the Rogowskii coil attached to the terminal portions. The measurement result demonstrated that almost equal currents are passed through the first and second layers.

As in the foregoing, according to the present invention, an oxide superconducting stranded wire having an insulation coating layer with high heat resistance, adhesiveness and strength may be provided. In the stranded wire obtained according to the present invention, sufficient electrical insulation is secured among the strands after the step of sintering. The stranded wire according to the present invention obtained after the sintering step has a high critical current and reduced ac losses. By integrating such stranded wires on a former, a cable conductor having reduced ac losses and allowing a large amount of current to be passed therethrough may be manufactured. The present invention also provides a structure with reduced ac losses in a multi-layer cable conductor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an oxide superconducting stranded wire using a wire comprising an oxide superconducting material and a matrix covering the material and consisting essentially of silver or a silver alloy, comprising the steps of:
    plating the surface of the matrix of said wire with a nonmagnetic metal which generates an electrically insulating oxide by oxidation at a temperature equal to or lower than a temperature necessary for sintering said oxide superconducting material;
    preparing a plurality of said wires plated with said nonmagnetic metal;
    twining the plurality of obtained wires into a stranded wire;
    oxidizing said nonmagnetic metal of the obtained stranded wire; and
    heating the obtained stranded wire up to the temperature necessary for sintering said oxide superconducting material.

2. The manufacturing method as recited in claim 1, wherein said nonmagnetic metal is at least one select ed from the group consisting of copper, tin and lead.

3. The manufacturing method as recited in claim 1, wherein the shape of a cross section of said wire perpendicular to the longitudinal direction of said wire is a circle or polygon substantially in rotation symmetry.

4. The manufacturing method as recited in claim 1, further comprising the step of performing plastic working to said wire before said step of plating.

5. The manufacturing met hod as recited in claim 1, further comprising the step of shaping the obtained stranded wire to have a sectoral cross section or into a flat form before the step of heating the wire up to the temperature necessary for sintering said oxide superconducting material.

6. A method of manufacturing an oxide superconducting cable conductor, comprising the step of integrating a plurality of the stranded wires obtained according to the manufacturing method as recited in claim 1 on a cylindrical or spiral former.

7. The method of manufacturing an oxide superconducting cable conductor as recited in claim 6, wherein
    in said step of integrating, said plurality of stranded wires are spirally wound on said former in a plurality of layers.

8. The method of manufacturing an oxide superconducting cable conductor as recited in claim 7, wherein
    in said step of integrating, the relation represented by $Pn \leqq Pm$ is established between the spirally winding pitch $Pm$ of said stranded wire in the m-th layer (m: an integer not less than 1) in said plurality of layers and the spirally winding pitch $Pn$ of said stranded wire in the n-the layer (n: an integer not less than 2, m<n) in said plurality of layers.

9. The method of manufacturing an oxide superconducting cable conductor as recited in claim 7, wherein
    in said step of integrating, a layer or layers having said stranded wire wound right-handedly and a layer or layers having said stranded wire wound left-handedly are formed, and
    the number of said right-handedly wound layer or layers and the number of left-handedly wound layer or layers are equal.

10. The method of manufacturing an oxide superconducting cable conductor as recited in claim 7, wherein
    the number of said plurality of layers is 2.

11. The method of manufacturing an oxide superconducting cable conductor as recited in claim 6, comprising the steps of:
    preparing said stranded wire having a plurality of oxide superconducting filaments having an approximately rectangular or elliptical cross section in an aspect ratio of at least 2 and having the longer axes of said cross section oriented in a particular direction; and
    integrating a plurality of said stranded wires on said former such that the longer axes of the cross sections of said plurality of oxide superconducting filaments are aligned in the circumferential direction of said former.

12. The manufacturing method as recited in claim 1, wherein
    the thickness of said plating nonmagnetic metal is at least 5 $\mu$m, and an oxide film having a thickness of at least 5 $\mu$m is generated in said oxidizing step.

13. A coated wire, comprising:
    a filament portion consisting essentially of an oxide superconducting material;
    a matrix covering said filament portion and consisting essentially of silver or a silver alloy; and
    an electrically insulating oxide layer generated by oxidation of a plating layer which covers the surface of said matrix and consists essentially of a nonmagnetic metal.

14. The coated wire as recited in claim 13, wherein
    said nonmagnetic metal is at least one selected from the group consisting of copper, tin and lead, and
    said oxide is at least one selected from the group consisting of copper oxide, tin oxide and lead oxide.

15. The coated wire as recited in claim 13, wherein
    the shape of a cross section of said wire perpendicular to the longitudinal direction of said wire is a circle or polygon substantially in rotation symmetry.

16. The oxide superconducting stranded wires as recited in claim 13, wherein the thickness of the oxide of said nonmagnetic metal is at least 5 μm.

17. An oxide superconducting cable conductor formed by integrating a plurality of the stranded wires as recited in claim 16 on a cylindrical or spiral former.

18. The oxide superconducting stranded wire as recited in claim 13, wherein the thickness of the oxide of said nonmagnetic metal is at least 5 μm.

19. An oxide superconducting cable conductor formed by integrating a plurality of the stranded wires as recited in claim 18 on a cylindrical or spiral former.

20. The coated wire as recited in claim 13, which comprises a plurality of said filament portions.

21. The coated wire as recited in claim 13, wherein the thickness of said plating layer is at least 5 μm.

22. The coated wire as recited in claim 13, wherein the thickness of the oxide of said nonmagnetic metal is at least 5 μm.

23. An oxide superconducting stranded wire comprising:

a plurality of wires twined into said stranded wire, each of said plurality of wires, comprising:

a filament portion consisting essentially of a sintered oxide superconducting material;

a matrix covering said filament portion and consisting essentially of silver or a silver alloy; and an electrically insulating oxide layer generated by oxidation of a plating layer which covers the surface of said matrix and consists essentially of a nonmagnetic metal, wherein said plurality of wires are electrically insulated from each other by said oxide of said nonmagnetic metal.

24. The oxide superconducting stranded wire as recited in claim 23, wherein said nonmagnetic metal is at least one selected from the group consisting of copper, tin and lead, and said oxide is at least one selected from the group consisting of copper oxide, tin oxide and lead oxide.

25. The oxide superconducting stranded wire as recited in claim 23, wherein the shape of a cross section perpendicular to the longitudinal direction of each of said plurality of wires is a circle or polygon substantially in rotation symmetry.

26. The oxide superconducting stranded wire as recited in claim 23, wherein each of said plurality of wires comprises a plurality of said filament portions.

27. The oxide superconducting stranded wire as recited in claim 23, which has a sectoral cross section or is in a flat form.

28. The oxide superconducting stranded wire as recited in claim 23, wherein the thickness of said plating layer is at least 5 μm.

29. An oxide superconducting cable conductor formed by integrating a plurality of stranded wires as recited in claim 23 on a cylindrical or spiral former.

30. An oxide superconducting cable conductor as recited in claim 29, wherein said plurality of stranded wires are wound spirally on said former in a plurality of layers.

31. The oxide superconducting cable conductor as recited in claim 30, wherein the relation represented by $Pn \leq Pm$ is established between the spirally winding pitch $Pm$ of said stranded wire in the m-th layer (m is an integer of at least 1) in said plurality of layers and the spirally winding pitch $Pn$ of said stranded wire in the n-th layer (n is an integer of at least 2, m<n) in said plurality of layers.

32. The oxide superconducting cable conductor as recited in claim 30, wherein a layer or layers having said stranded wire wound right-handedly and a layer or layers having said stranded wire wound left-handedly are formed, and the number of said right-handedly wound layer or layers and the number of said left-handedly wound layer or layers are equal.

33. The oxide superconducting cable conductor as recited in claim 30, wherein the number of said plurality of layers is 2.

34. The oxide superconducting cable conductor as recited in claim 29, wherein cross sections of a plurality of filaments consisting essentially of said oxide superconducting material inside said stranded wire are each an approximate rectangle or ellipse in an aspect ratio of at least 2, and the longer axes of the cross section of said plurality of filaments are aligned in the circumferential direction of said former in said stranded wire.

* * * * *